(12) United States Patent
Ping et al.

(10) Patent No.: US 9,865,528 B2
(45) Date of Patent: Jan. 9, 2018

(54) HIGH POWER AND HIGH FREQUENCY PLASTIC PRE-MOLDED CAVITY PACKAGE

(71) Applicant: UBOTIC COMPANY LIMITED, Tsuen Wan (HK)

(72) Inventors: Zhang Xiao Ping, Ningdu (CN); Sin Chi Wai, Kowloon (HK)

(73) Assignee: UBOTIC COMPANY LIMITED, Tsuen Wan (HK)

( * ) Notice: Subject to any disclaimer, the term of this patent is extended or adjusted under 35 U.S.C. 154(b) by 0 days.

(21) Appl. No.: 14/966,636

(22) Filed: Dec. 11, 2015

(65) Prior Publication Data

US 2017/0170102 A1    Jun. 15, 2017

(51) Int. Cl.
| | |
|---|---|
| *H01L 21/44* | (2006.01) |
| *H01L 21/48* | (2006.01) |
| *H01L 21/50* | (2006.01) |
| *H01L 23/495* | (2006.01) |
| *H01L 23/373* | (2006.01) |
| *H01L 23/367* | (2006.01) |
| *H01L 23/04* | (2006.01) |
| *H01L 23/00* | (2006.01) |

(52) U.S. Cl.
CPC ........ *H01L 23/49568* (2013.01); *H01L 21/50* (2013.01); *H01L 23/04* (2013.01); *H01L 23/3675* (2013.01); *H01L 23/3731* (2013.01); *H01L 23/49548* (2013.01); *H01L 24/06* (2013.01); *H01L 24/29* (2013.01); *H01L 24/32* (2013.01); *H01L 24/48* (2013.01); *H01L 24/49* (2013.01); *H01L 24/73* (2013.01); *H01L 24/92* (2013.01); *H01L 24/97* (2013.01); *H01L 2224/04042* (2013.01); *H01L 2224/06181* (2013.01); *H01L 2224/291* (2013.01); *H01L 2224/2929* (2013.01); *H01L 2224/29339* (2013.01); *H01L 2224/32245* (2013.01); *H01L 2224/48091* (2013.01); *H01L 2224/48247* (2013.01); *H01L 2224/49175* (2013.01); *H01L 2224/73265* (2013.01); *H01L 2224/92247* (2013.01); *H01L 2224/97* (2013.01); *H01L 2924/16195* (2013.01)

(58) Field of Classification Search
CPC ..... H01L 21/52; H01L 21/563; H01L 23/293; H01L 23/3675; H01L 23/3731; H01L 23/49548; H01L 24/43; H01L 24/46; H01L 21/56; H01L 21/4814; H01L 23/49568; H01L 23/495; H01L 23/3733; H01L 23/3164; H01L 23/291; H01L 23/28
USPC ......................... 438/122, 123, 124, 126, 127
See application file for complete search history.

(56) References Cited

U.S. PATENT DOCUMENTS

| | | | | |
|---|---|---|---|---|
| 2005/0077616 A1* | 4/2005 | Ng | ........................... | H01L 23/36 257/707 |
| 2010/0314635 A1* | 12/2010 | Brunner | ................... | H01L 33/62 257/88 |
| 2014/0239413 A1* | 8/2014 | Stella | ....................... | H01L 24/36 257/401 |

* cited by examiner

*Primary Examiner* — Kimberly Rizkallah
*Assistant Examiner* — Dilinh Nguyen
(74) *Attorney, Agent, or Firm* — Perry + Currier Inc.

(57) ABSTRACT

A cavity package is set forth along with a method of manufacturing thereof. According to one embodiment, the method comprises attaching a metal heat sink to a leadframe using an intermediate structure that is thermally conductive and electrically insulating; molding a plastic body around the heat sink and exposed leads of the leadframe to form a cavity, with partially and selectively exposed lead top surfaces, heat sink top surface, and heat sink bottom surface; attaching a semiconductor device die within cavity on to the exposed top surface of the heat sink using a thermal conductive material; wire bonding respective wire bond pads of the semiconductor device die to the exposed lead top surfaces and to the heat sink for grounding; and attaching a lid to the plastic molded body to protect the wire bonded device within cavity.

4 Claims, 28 Drawing Sheets

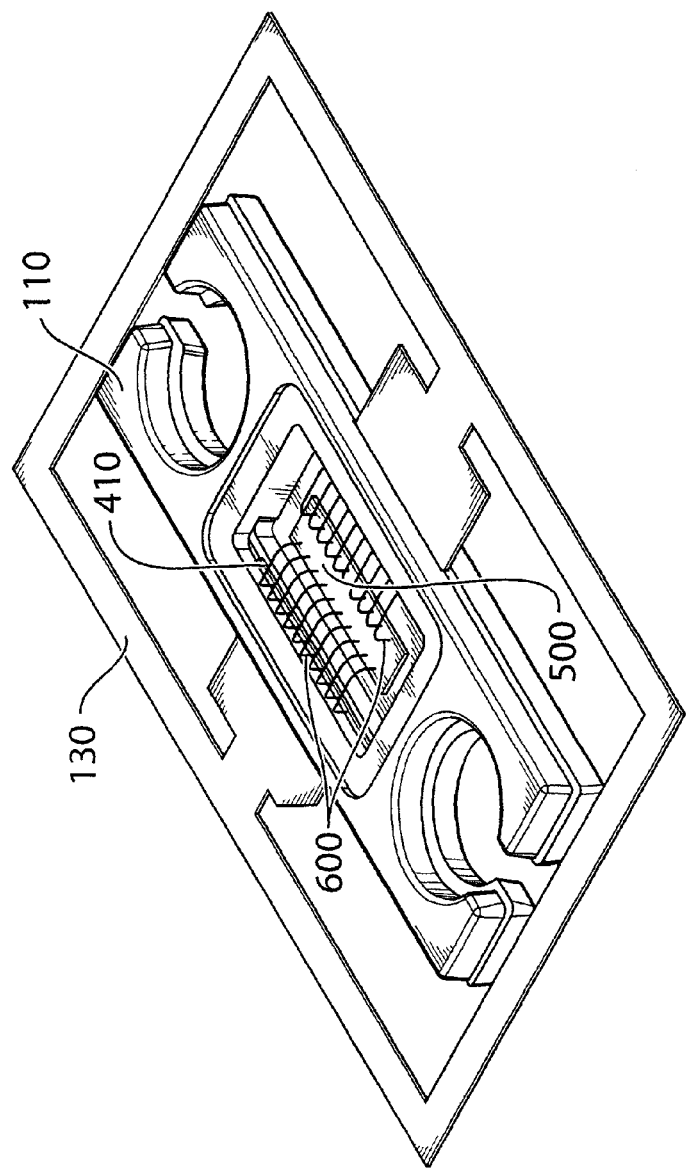

HIGH POWER AND HIGH FREQUENCY PLASTIC PRE-MOLDED CAVITY PACKAGE

FIELD OF INVENTION

The present invention relates generally to integrated circuits, and more particularly in one aspect to a high power, high frequency plastic pre-molded cavity package and in another aspect to a hermetically sealed high power, high frequency plastic pre-molded cavity package.

BACKGROUND

Ceramic cavity and plastic over-mold with embedded heat sink packages are known in the art for housing high power, high frequency devices such as RF power transistors. Ceramic cavity packages are designed with a cavity (containing air or nitrogen) for housing a semiconductor die (IC), whereas plastic-molded packages contain minimal air in the package. The basic structure of such packages is a die attach pad on which the semiconductor die is mounted, a thermally conductive heat sink or heat spreader for dissipating heat from the die, metal leads for signal input/output with the semiconductor die, and a cap or lid. In cavity packages, the lid is metal whereas in over-mold plastic packages the entire package is over-molded in plastic, but with a portion of the heat sink exposed.

Prior art ceramic cavity packages are expensive in terms of the material used, exhibit poor thermal performance due to the use of ceramic-copper-based laminate material for the heat sink, and are not scalable for mass production.

One reason for the development of plastic over-molded with embedded heat sink packages was to provide improved thermal performance over ceramic cavity packages. Plastic packages use a copper heat sink on which the IC is mounted instead of the copper-based laminate material used in prior art cavity packages, such that when the die is mounted on the copper heat spreader, there is a reduction in the thermal resistance as compared to when the die is mounted on air cavity packages having a ceramic-copper-based laminate heat sink.

Also, prior art ceramic cavity packages are typically assembled individually, whereas plastic packages are assembled in a leadframe configuration as a group. This makes the assembly process faster and results in less manual handling.

However, plastic over-mold with embedded heat sink packages suffer from the disadvantage of not providing a cavity, as well as lacking a good thermal path from the leadframe to the heat sink because the top surface of the heat sink does not in direct contact with the bottom surface of the leads of the leadframe.

SUMMARY

A cavity package and method of fabrication are set forth for ameliorating at least some of the disadvantages of prior art ceramic and plastic over-mold packages. According to a first embodiment of the present invention, a metal heat sink is attached to a leadframe via an intermediate structure that is thermally conductive but electrically insulating. A plastic body is molded onto the integrated heat sink and leadframe to form a cavity, with partially and selectively exposed lead surfaces as well as top and bottom surfaces of the heat sink. The die is attached to the exposed top surface of the heat sink within the cavity and wire bonded to the lead surfaces. Finally, a lid is attached to the plastic molded body to seal the cavity.

In accordance with another aspect of the first embodiment, there is provided a method comprising attaching a metal heat sink to a leadframe using an intermediate structure that is thermally conductive and electrically insulating; molding a plastic body around the heat sink and exposed leads of the leadframe to form a cavity, with partially and selectively exposed lead top surfaces, heat sink top surface, and heat sink bottom surface; attaching a semiconductor device die within cavity on to the exposed top surface of the heat sink using a thermal conductive material; wire bonding respective wire bond pads of the semiconductor device die to the exposed lead top surfaces and to the heat sink for grounding; and attaching a lid to the plastic molded body to protect the wire bonded device within cavity.

According to a second embodiment, a metal heat sink is attached to a leadframe via a first intermediate ring-type structure that is thermally conductive but electrically insulating. A further thermally conductive and electrically insulating ring-type intermediate structure is attached to the top of the leadframe. In one embodiment, each ring-type structure preferably comprises a "sandwich" of thin metal portions bonded to top and bottom surfaces of a ceramic middle portion. Opposite sides of the top thin metal portion of the first ring-type structure are bonded to respective bottom surfaces of the metal leads, while the bottom surface of the first ring-type structure is bonded to the heat sink. Opposite sides of the bottom thin metal portion of the further ring-type structure are bonded to respective top surfaces of the metal leads. A plastic body is molded onto the integrated heat sink and leadframe to form a cavity, with partially and selectively exposed portions of the metal leads as well as top and bottom surfaces of the heat sink and the top thin metal portion of the further ring-type intermediate structure. The die is attached to the exposed top surface of the heat sink within the cavity and wire bonded to the lead surfaces. Finally, a metal lid is attached to the plastic molded body to seal the cavity.

In accordance with a further aspect of the second embodiment, there is provided a method comprising attaching a metal heat sink to a leadframe using an intermediate structure that is thermally conductive and electrically insulating; molding a plastic body around the heat sink and exposed leads of the leadframe to form a cavity, with partially and selectively exposed lead top surfaces, heat sink top surface, and heat sink bottom surface; attaching a semiconductor device die within cavity on to the exposed top surface of the heat sink using a thermal conductive material; wire bonding respective wire bond pads of the semiconductor device die to the exposed lead top surfaces and to the heat sink for grounding; and attaching a metal lid to the plastic molded body to protect the wire bonded device within cavity.

In accordance with an additional aspect the metal heat sink comprises copper (Cu) or other metal alloy.

In a variant of the first embodiment, the intermediate structure is ceramic.

In accordance with an additional aspect, the leadframe preferably includes a rectangular outer frame.

In accordance with an additional aspect of the first embodiment, the thermal conductive material comprises one of either silver epoxy or solder.

In accordance with an additional aspect of the first embodiment, the lid is attached to the plastic molded body by means of epoxy.

In accordance with an additional aspect of the first embodiment, the lid is made of liquid crystal polymer, epoxy mold compound, metal or other suitable material.

In accordance with a further aspect of the first embodiment, a cavity package is provided comprising a plastic body surrounding and partially exposing an integrated heat sink and leads of a leadframe, and a lid.

In accordance with an additional aspect of the first embodiment, the cavity package includes a pair of leads extending from opposite sides of the leadframe.

In accordance with an additional aspect of the first embodiment, the cavity package includes at least two leads extending from each side of the leadframe.

According to a further aspect of the second embodiment, each intermediate "sandwich" structure comprises ceramic with Direct Bond Copper (DBC) in which a thin layer of copper is bonded to the top and bottom surfaces of the ceramic middle portion. The thin layers of copper are electrically isolated from each other by the intermediate ceramic portion. The shape of the ceramic portion as well as the pattern of the thin layers of copper can be designed and fabricated in accordance with methodologies known to persons of skill in the art. The bottom thin layer of copper of the first intermediate structure is bonded to the top side of the heat sink (e.g. using Ag epoxy or soldering). In one embodiment, the pattern of the bottom thin layer of copper is a complete ring pattern. Since the top thin layer of copper is designed to bond to the bottom side of the two leads of the package and since the two leads are eventually electrically isolated after singulation, the pattern of the top thin layer of copper of the first intermediate structure can be a broken ring shape (e.g. a "[ ]" shape, for a two-lead package design).

In accordance with an additional aspect of the second embodiment, the thermal conductive material of both the first and further intermediate structures comprises one of either silver epoxy or solder.

In accordance with an additional aspect of the second embodiment, the lid is attached to the metal ring portion of the further intermediate structure on top of the metal leads, for example via solder.

In accordance with an additional aspect of the second embodiment, the lid may be made of copper, stainless steel plated with nickel and/or Sn to facilitate the soldering process.

The cavity package according to the present invention is small and lightweight, with good thermal and electrical performance that makes it suitable for industrial high power and high frequency applications. The cavity package according to the present invention is more cost effective than ceramic cavity packages because it uses more common materials such as copper and plastic epoxy molding compound, and can be manufactured in high volume due to its multiple leadframe construction.

The cavity package according to the present invention is suitable for high frequency and high power applications (e.g. RF switching transistors) by providing an integrated heat sink for dissipating heat generated by the die and wires through the leadframe and intermediate structure. High frequency operation is made possible due to the air cavity in which the die and bonded wires are disposed (air having the best dielectric constant for high speed).

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIGS. 6A and 6B are top perspective detail and full views, respectively, showing wire bonding of the die to exposed lead top surfaces, according to the method of FIG. 2.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENTS

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

Figure 1A:
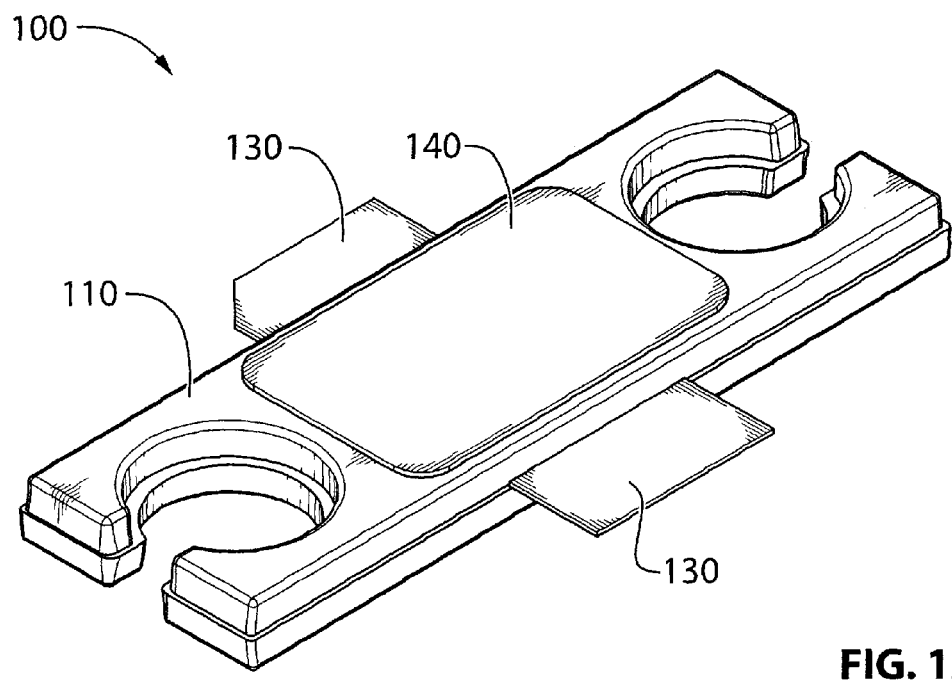
FIGS. 1A and 1B are top and bottom perspective views, respectively, of a cavity package according to an exemplary first embodiment.
Figure 1B:
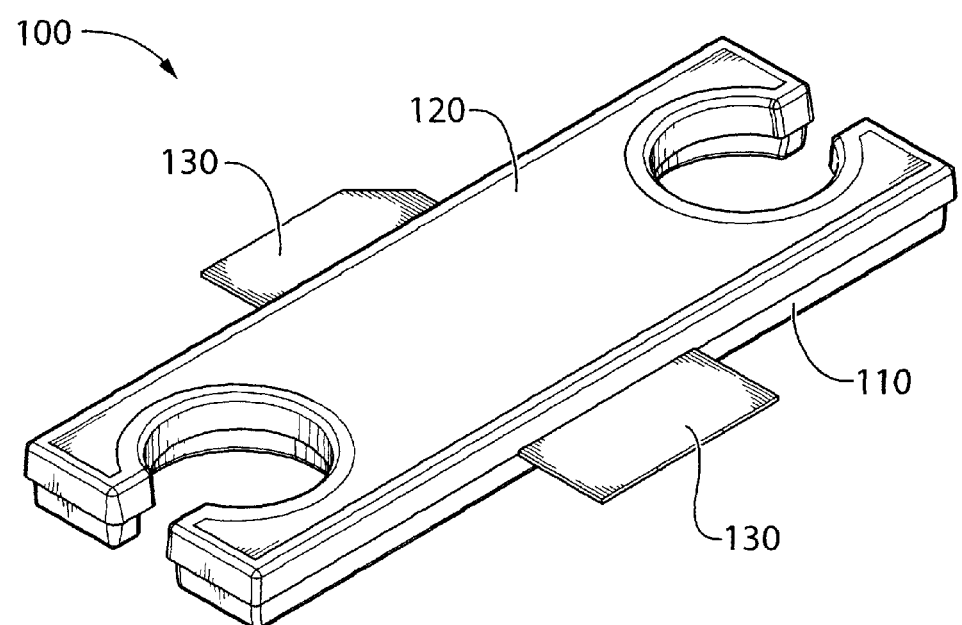

A high power, high frequency plastic pre-molded cavity package 100 is shown in FIGS. 1A and 1B, according to a first exemplary embodiment, comprising a plastic body 110 surrounding and partially exposing an integrated heat sink 120 and leads 130 of a leadframe 300 (see FIGS. 3A and 3B), and a lid 140.

Figure 2:
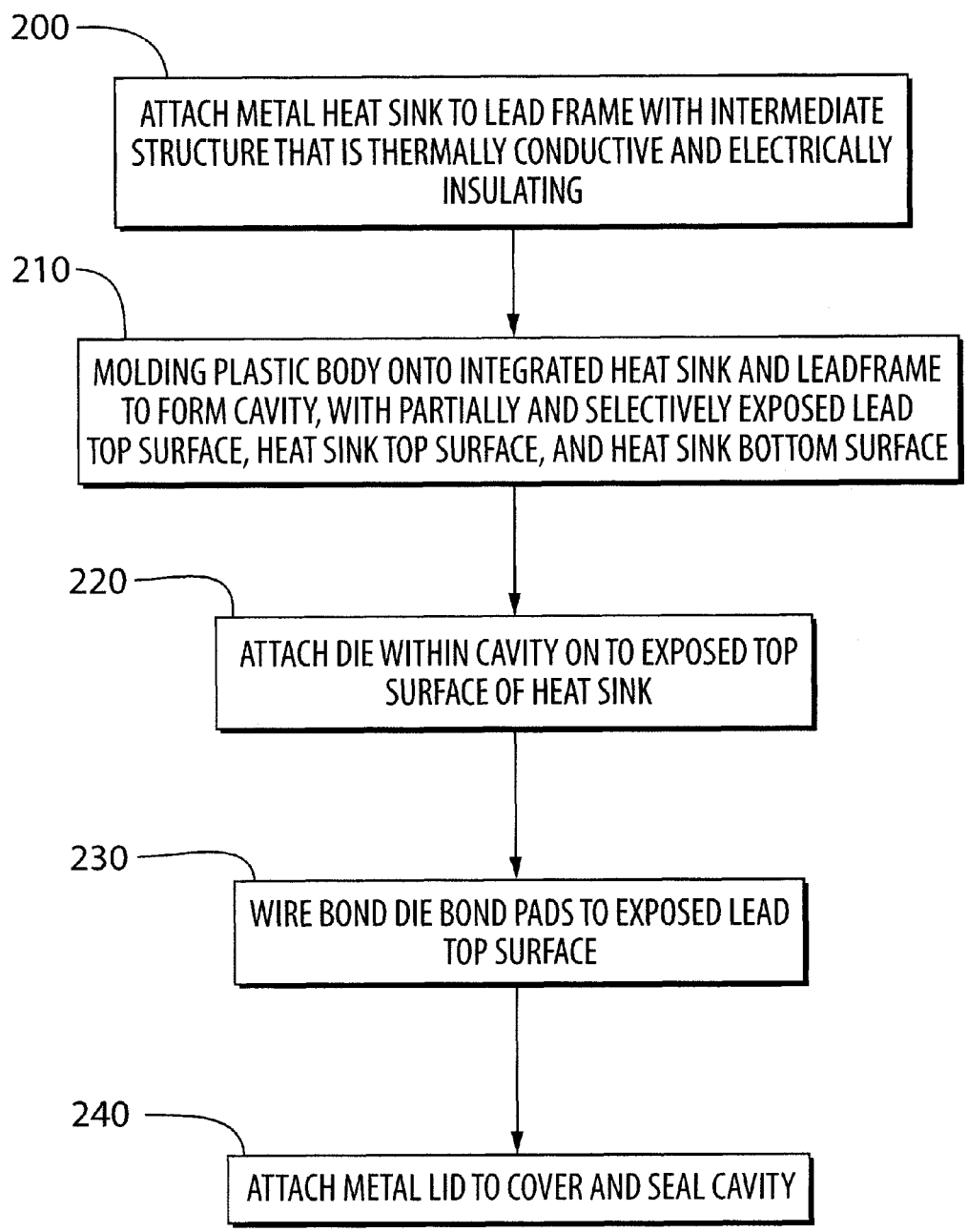
FIG. 2 is a flow chart showing steps of a method for fabricating the cavity package of FIGS. 1A and 1B.

With reference to FIGS. 3A through 7B, construction of cavity package 100 is shown, according to steps of an exemplary method depicted in FIG. 2. It should be noted that whereas FIGS. 3A through 7B set forth construction of a single cavity package, in practice a matrix comprising a plurality of cavity packages is fabricated so that multiple packages are fabricated simultaneously and then singulated into individual packages.

Figure 3A:
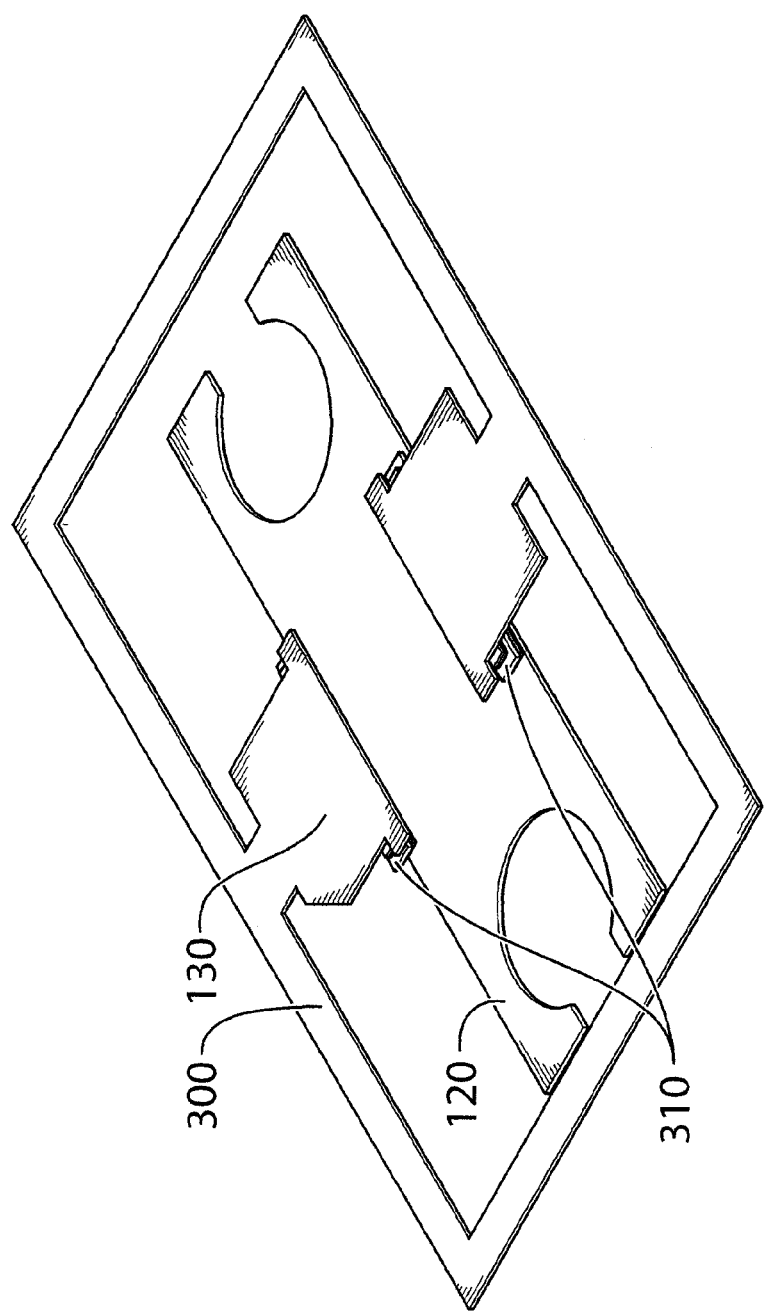
FIGS. 3A and 3B are top and bottom perspective views, respectively, showing attachment of a heat sink to the bottom of a leadframe, according to the method of FIG. 2.
Figure 3B:
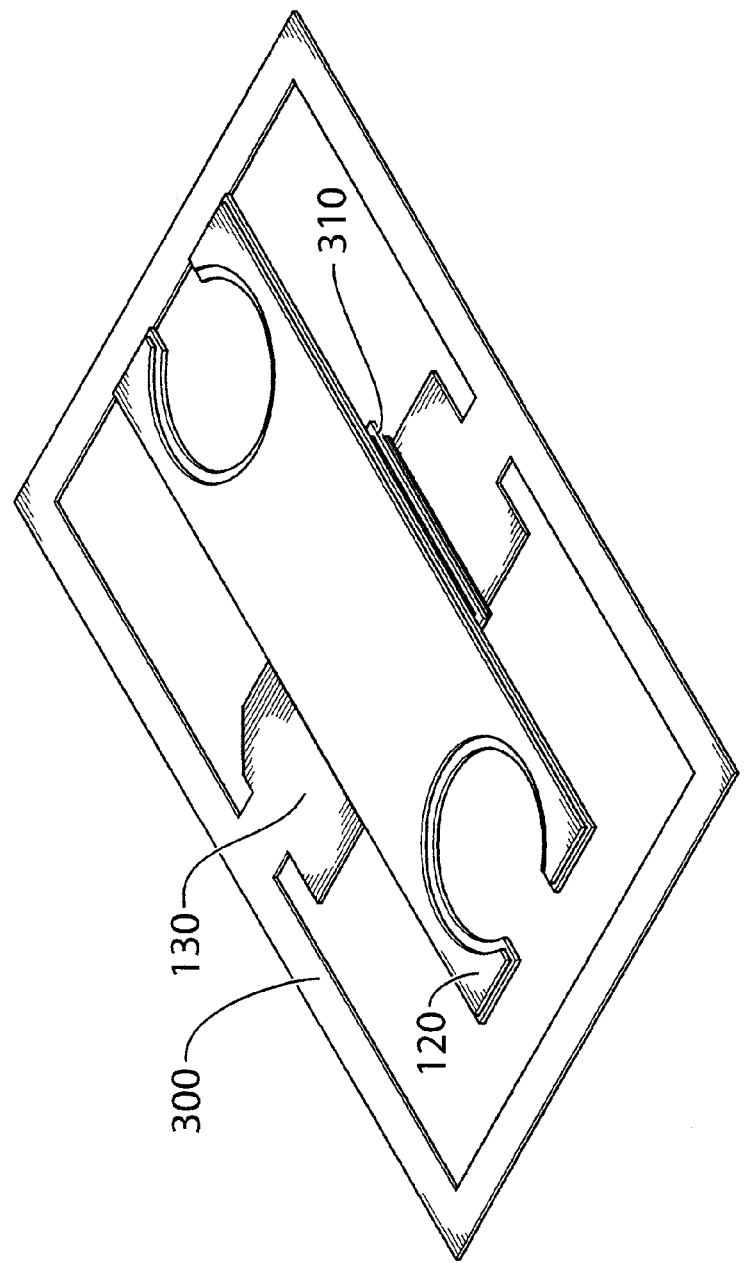

Construction of the cavity package begins at step 200 (FIG. 2) with attachment a metal heat sink (e.g. Cu or other metal alloy) to leadframe 300 using an intermediate structure 310 that is thermally conductive and electrically insulating. In one variant, the intermediate structure 310 is ceramic. As illustrated in FIGS. 3A and 3B, the leadframe 300 preferably includes a rectangular outer frame that forms one of a plurality of repeating units (not shown) to form a matrix for simultaneously fabrication a post-manufacturing singulation, as discussed above. Also, although only a pair of leads 130 are shown extending from opposite sides of the leadframe, it is contemplated that two or more leads may extend from each side, depending on the intended application of the cavity package.

Figure 4A:
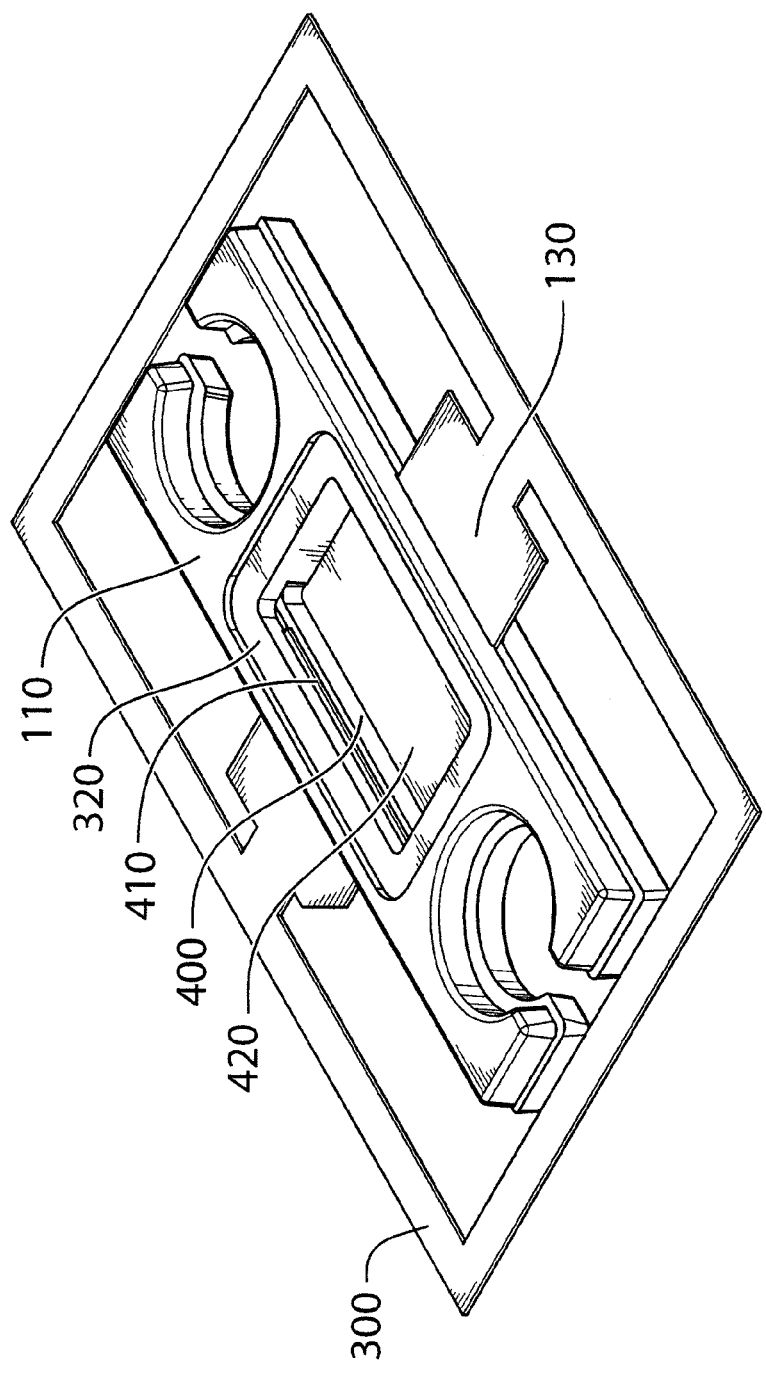
FIGS. 4A and 4B are top perspective views taken from the side and end, respectively, showing the molding of a plastic body onto the integrated heat sink and leadframe of FIGS. 3A and 3B, for forming a cavity, according to the method of FIG. 2.
Figure 4B:
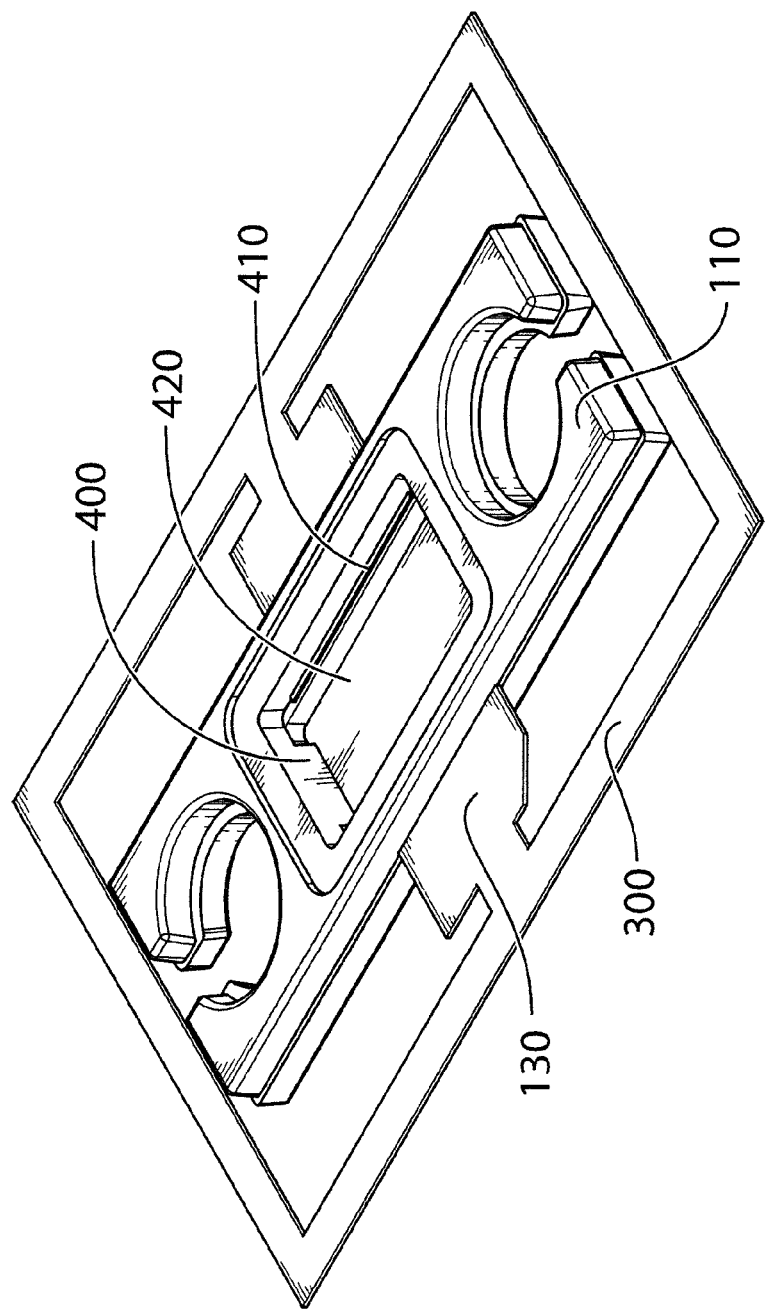
Figure 4C:
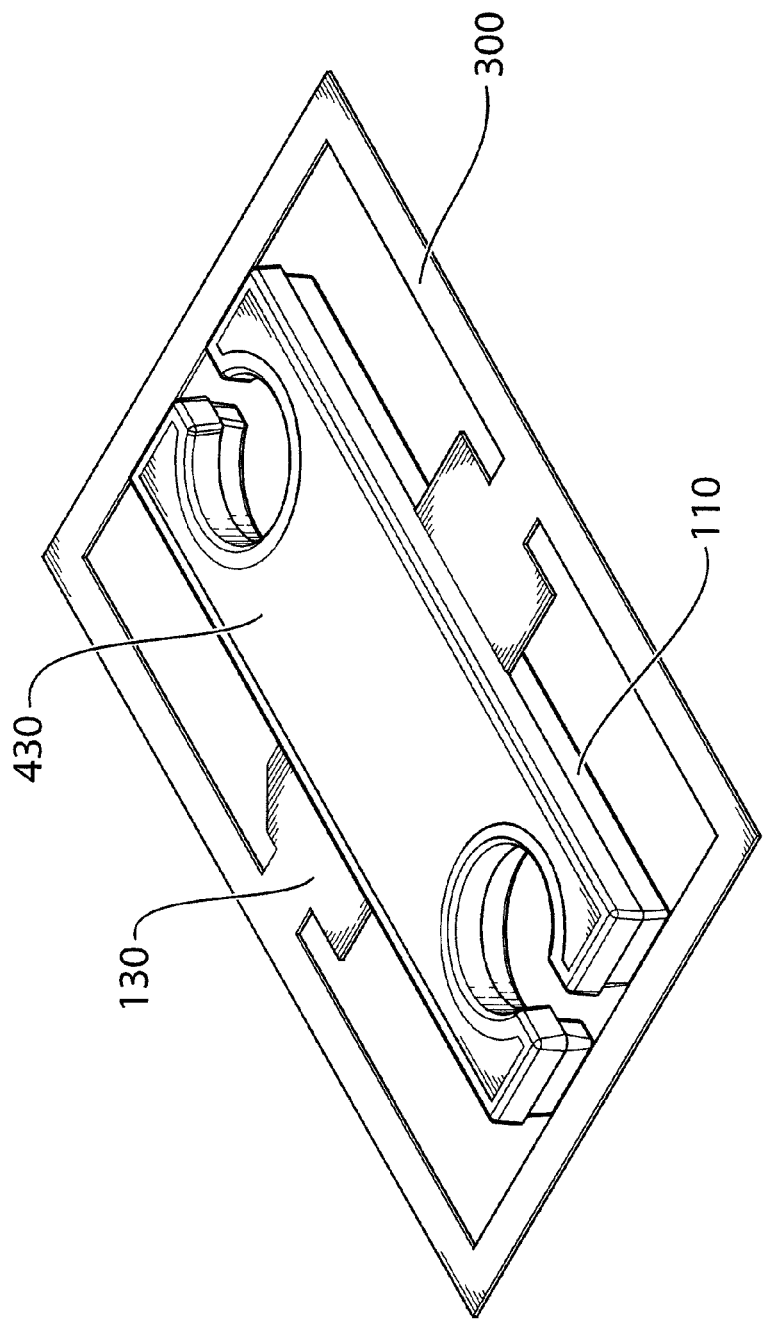
FIG. 4C is a bottom perspective view showing the molding of a plastic body onto the integrated heat sink and leadframe of FIGS. 3A and 3B, according to the method of FIG. 2.

At step 210, plastic body 110 is molded around the integrated heat sink 120 and leads 130 of leadframe 300 to form a cavity 400, with partially and selectively exposed lead top surface 410, heat sink top surface 420, and heat sink bottom surface 430, as shown in FIGS. 4A-4C. The exposed heat sink bottom surface 430 conducts heat from the cavity 400 to be dissipated in a mother board (not shown) to which the cavity package is mounted post-fabrication.

Figure 5A:
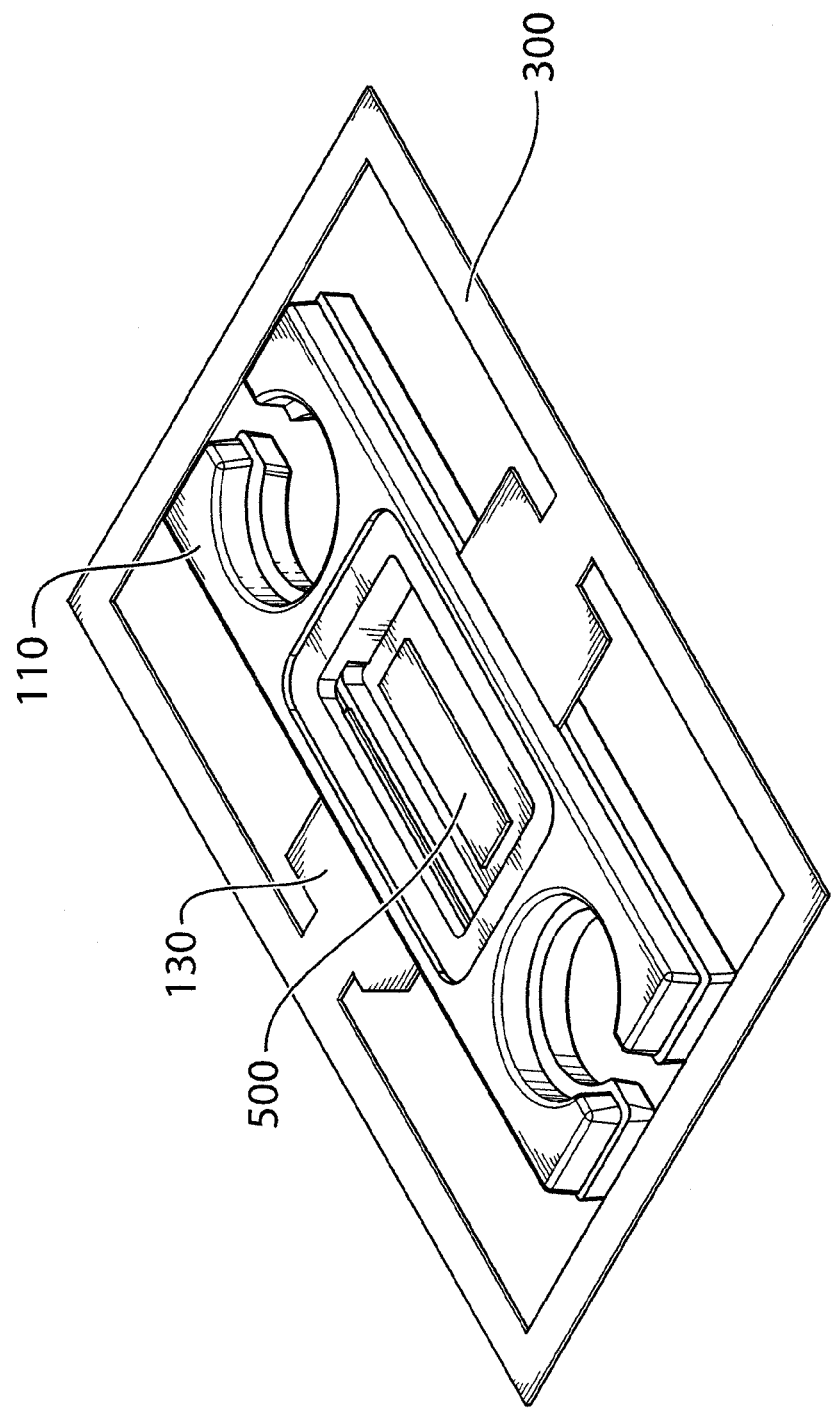
FIGS. 5A and 5B are top perspective and plan views, respectively, showing attachment of a semiconductor die (integrated circuit) onto an exposed portion of the heat sink within the cavity, according to the method of FIG. 2.
Figure 5B:
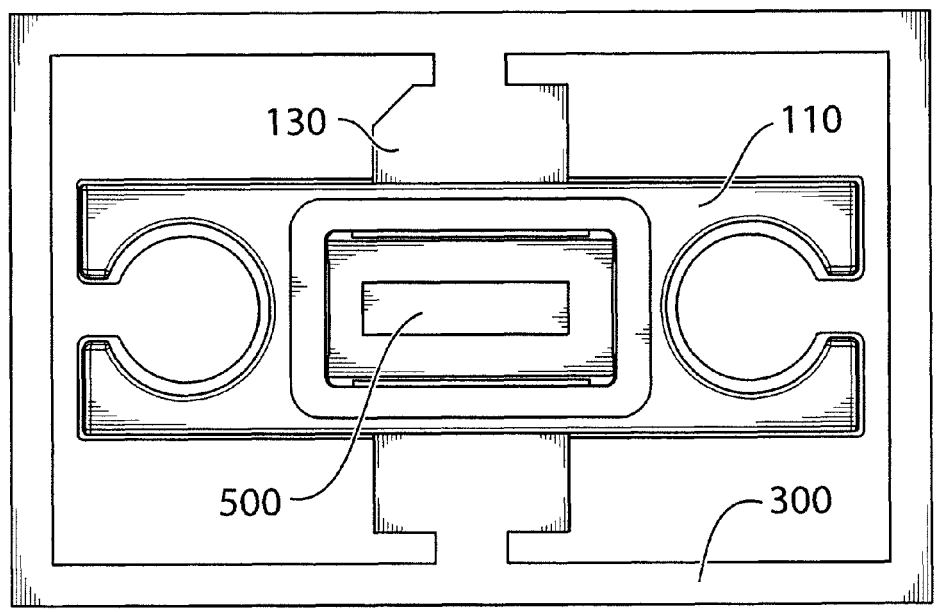

At step 220, a semiconductor device die 500 (i.e. the IC) is placed within cavity 400 on to exposed top surface 420 of the heat sink and attached to the using a thermal conductive material, such as silver epoxy, solder, etc., as shown in FIGS. 5A and 5B.

Figure 6A:
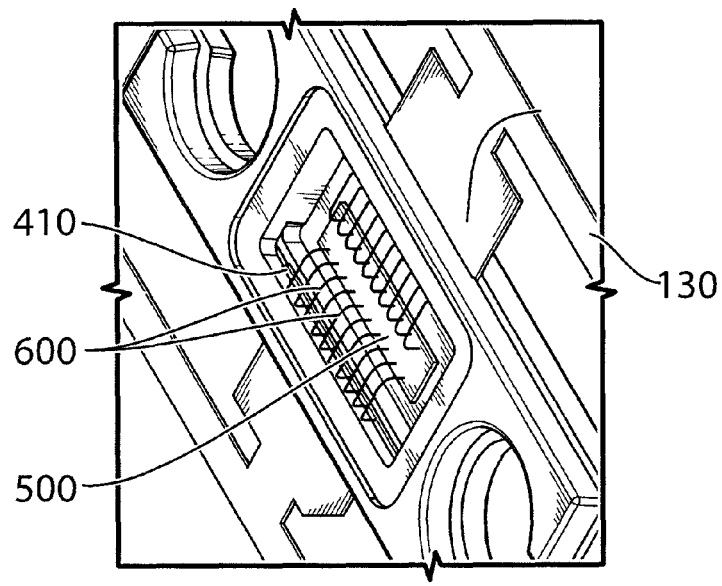
Figure 7A:
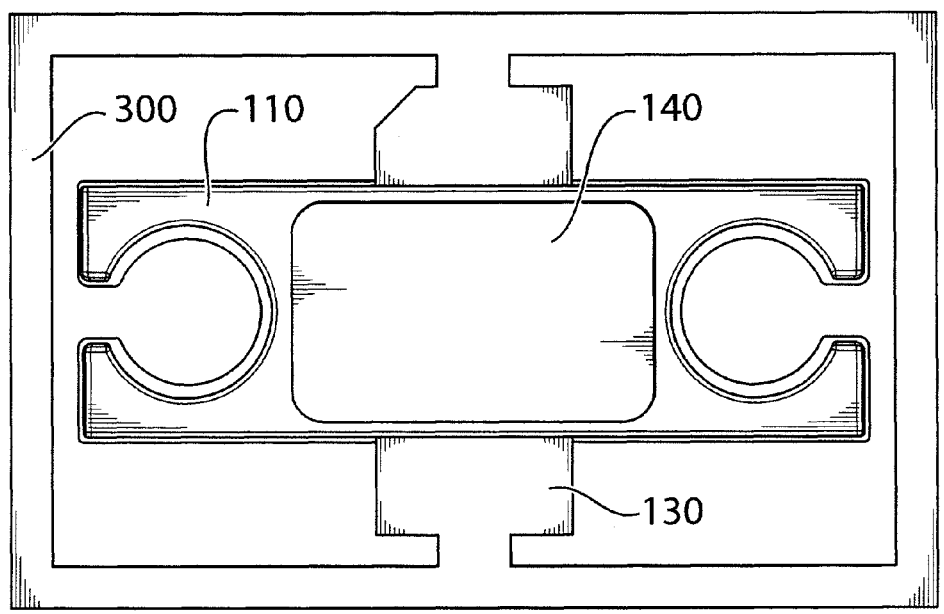
FIGS. 7A and 7B are plan and top perspective views, respectively, showing attachment of a lid for covering and sealing the cavity, according to the method of FIG. 2.
Figure 7B:
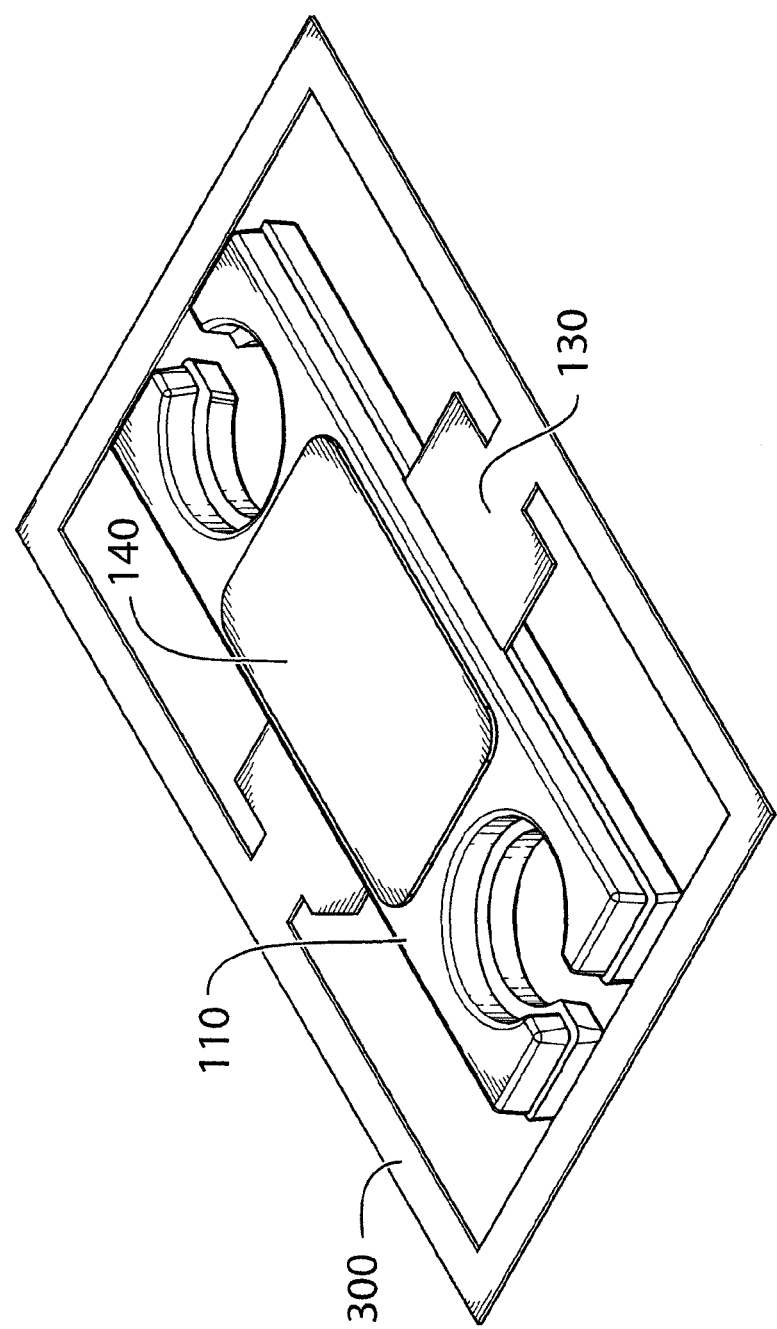

Respective wire bond pads of semiconductor device die 500 are then wire bonded 600 to the exposed lead top surfaces 410 and to the heat sink 120 for grounding, at step 230, as shown in FIGS. 6A and 6B. For example, when used in a high power, high frequency application such as a RF switching transistor, one lead is bonded to the transistor source and the other lead is bonded to the transistor drain, wherein the drain of the transistor chip comprises the entire die back side such that once the die 500 is attached to the heat sink 120, the heat sink becomes the drain. The die top has a source pad as well as the gate pad such that one of the leads can be connected to the source while the other lead is connected to the gate.

Finally, at step 240, lid 140 is attached 11190 is attached to the plastic molded body 110 by means of epoxy to protect the wire bonded device within cavity 400. The lid may be made of liquid crystal polymer, epoxy mold compound, metal or other suitable material.

As discussed above, in practice a matrix of cavity packages is fabricated (not shown) such that after the lid 140 has been attached, the matrix is singulated (e.g. using saw singulation) to create packages, such as the package shown in FIGS. 1A and 1B.

Figure 8A:
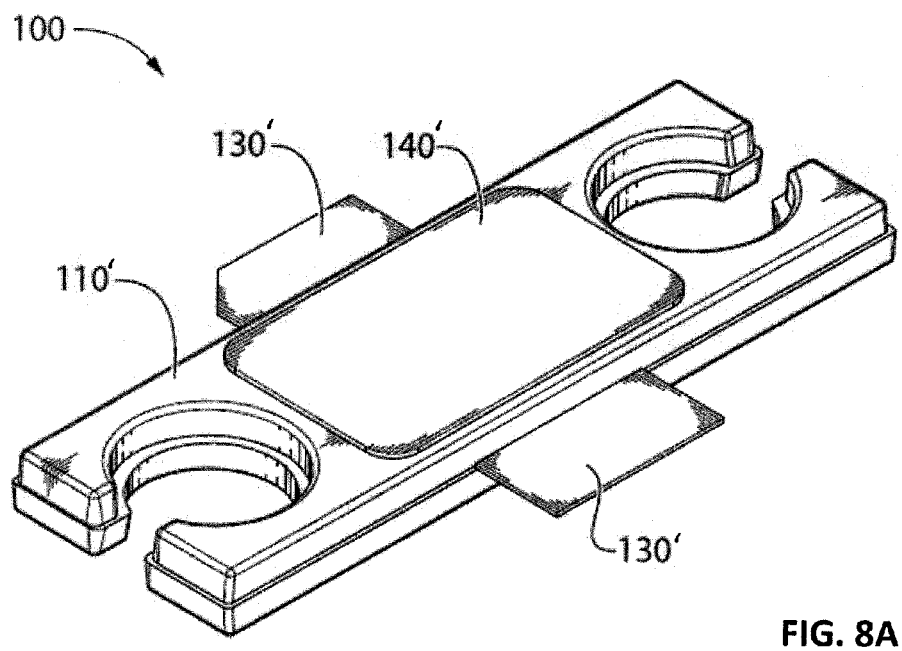
FIGS. 8A and 8B are top and bottom perspective views, respectively, of a cavity package according to a second exemplary embodiment.
Figure 8B:
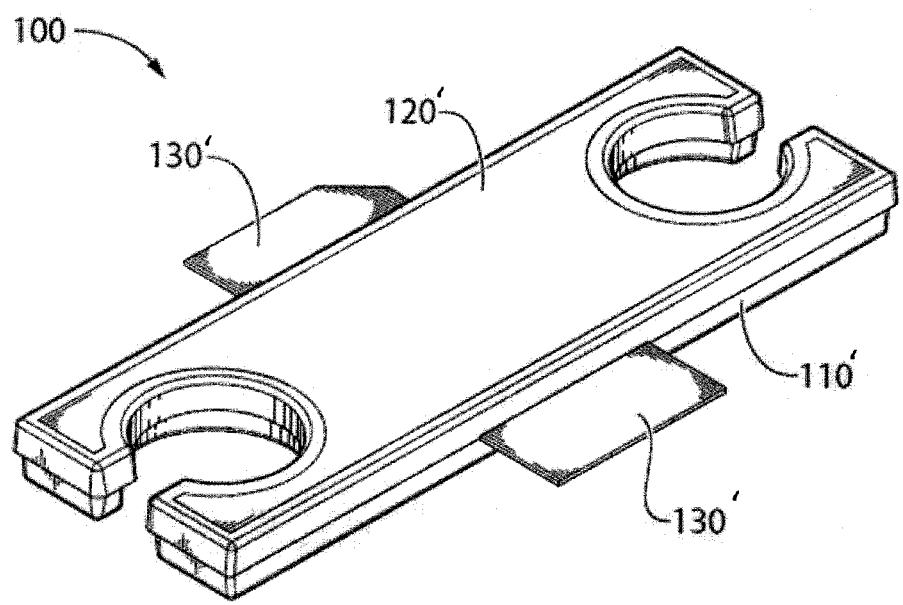

A high power, high frequency plastic pre-molded cavity package 100 is shown in FIGS. 8A and 8B, according to a second exemplary embodiment, comprising a plastic body 110' surrounding and partially exposing an integrated heat sink 120' and leads 130' of a leadframe 300' (see FIGS. 10A and 10B), and a lid 140'.

Figure 9:
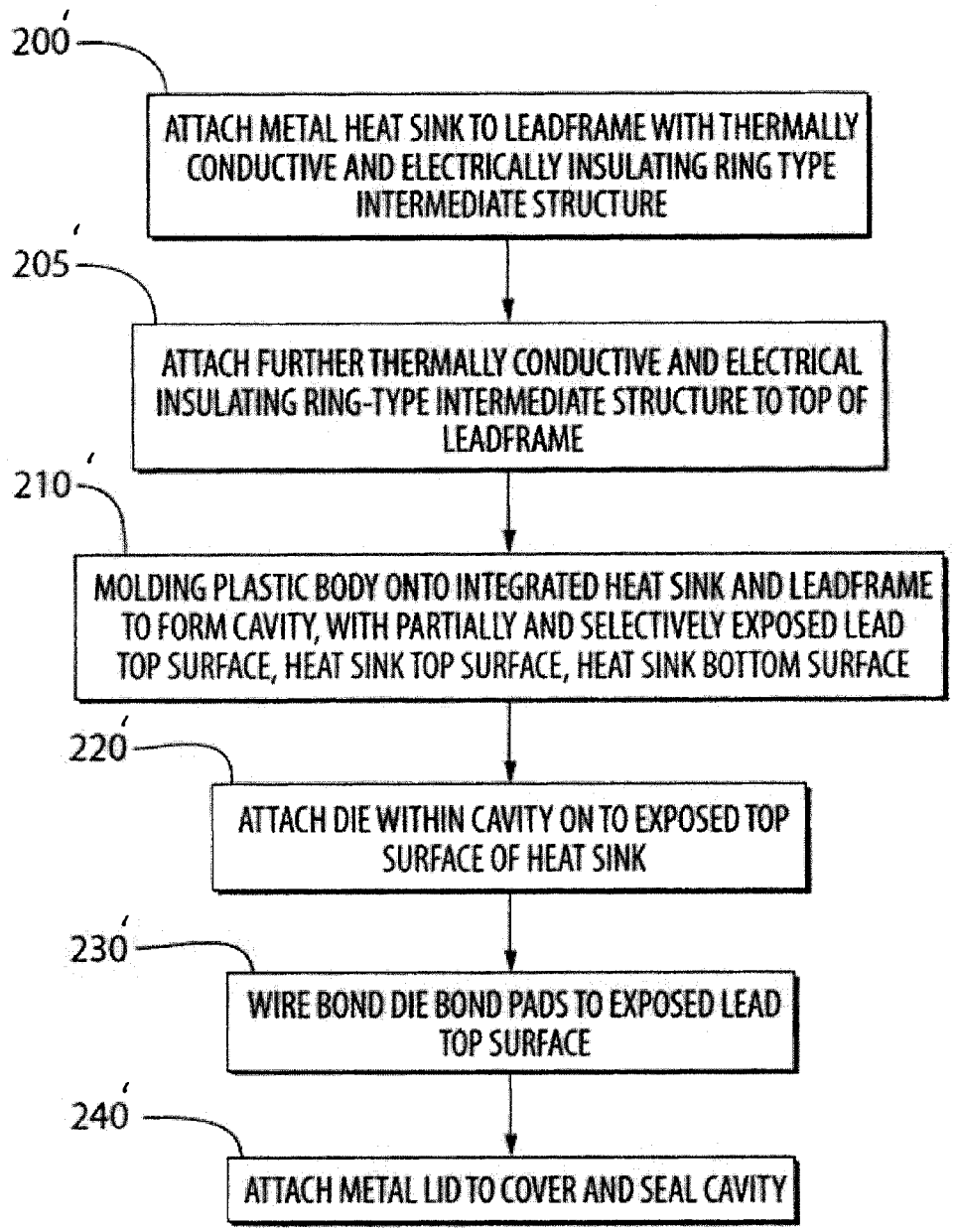
FIG. 9 is a flow chart showing steps of a method for fabricating the cavity package of FIGS. 8A and 8B.

With reference to FIGS. 10A through 14B, construction of cavity package 100 is shown, according to steps of an exemplary method depicted in FIG. 9. It should be noted that whereas FIGS. 10A through 14B set forth construction of a single cavity package, in practice a matrix comprising a plurality of cavity packages is fabricated so that multiple packages are fabricated simultaneously and then singulated into individual packages.

Construction of the cavity package begins at step 200' (FIG. 9) with attachment metal heat sink 120' (e.g. Cu or other metal alloy) to leadframe 300' using a first ring-type intermediate structure 310' that is thermally conductive and electrically insulating. In one embodiment, the intermediate structure 310' comprises a "sandwich" structure of ceramic and Direct Bond Copper (DBC), wherein a thin layer of copper is bonded to top and bottom surfaces of a ceramic middle portion. The shape of the ceramic portion as well as the pattern of the thin layers of copper can be designed and fabricated in accordance with methodologies known to persons of skill in the art. The bottom thin layer of copper of the first intermediate structure is bonded to the top side of the heat sink (e.g. using Ag epoxy or soldering). In one embodiment, the pattern of the bottom thin layer of copper is a complete ring pattern. Since the top thin layer of copper is designed to bond to the bottom side of the two leads of the package and since the two leads are eventually electrically isolated after singulation, the pattern of the top thin layer of copper of the first intermediate structure can be a broken ring shape (e.g. a "[ ]" shape, for a two-lead package design), as shown in FIG. 10A.

Figure 10A:
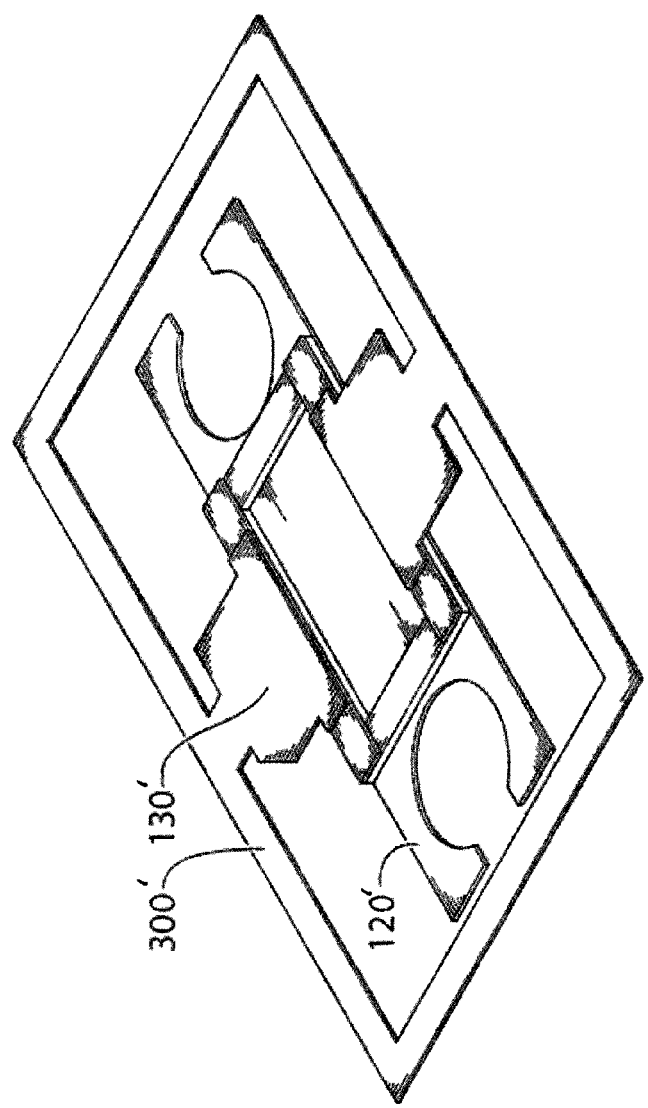
FIGS. 10A and 10B are top and bottom perspective views, respectively, showing attachment of a heat sink to the bottom of a leadframe via a thermally conductive and electrically insulating ring-type intermediate structure, according to the method of FIG. 9.
Figure 10B:
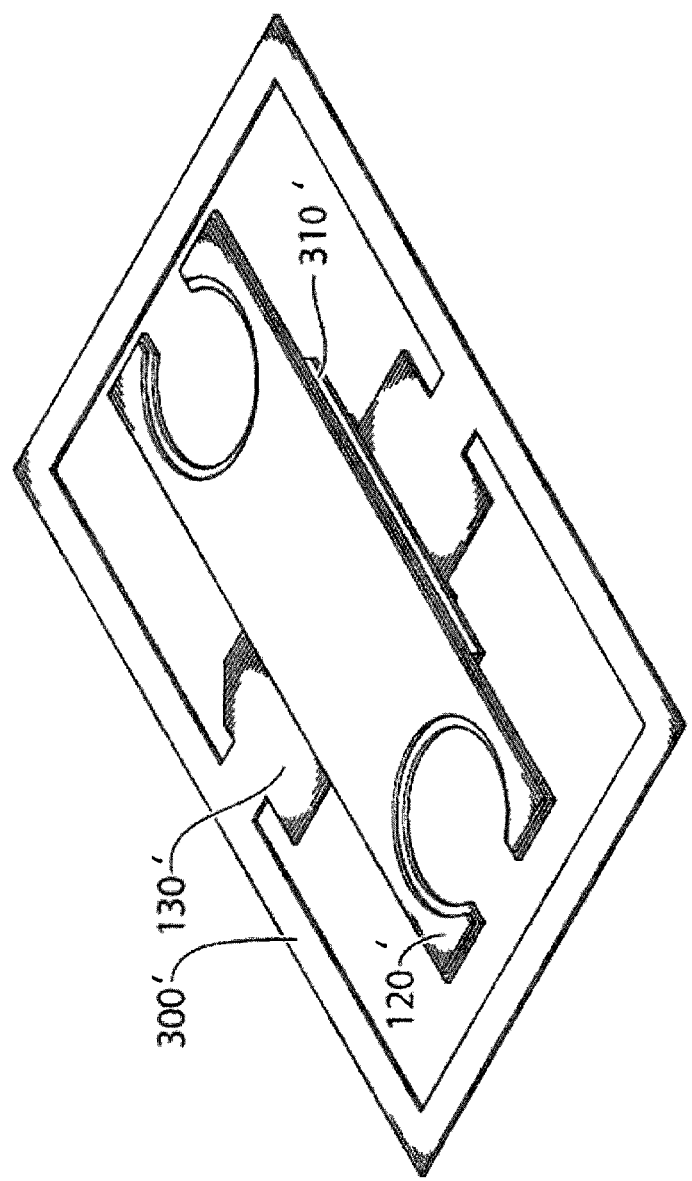
Figure 10C:
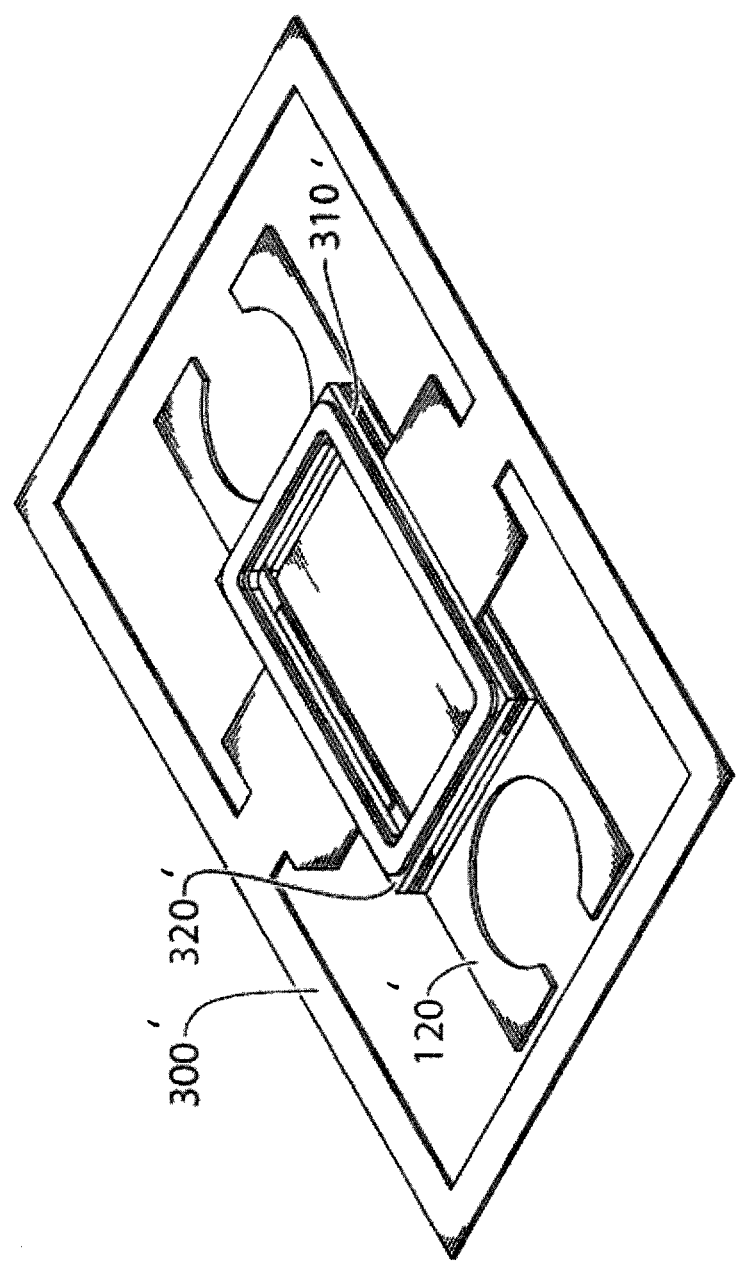
FIGS. 10C, 10D and 10E are top perspective, plan and elevation views, respectively, showing attachment of a further thermally conductive and electrically insulating ring-type intermediate structure to the top of the leadframe, according to the method of FIG. 9.
Figure 10D:
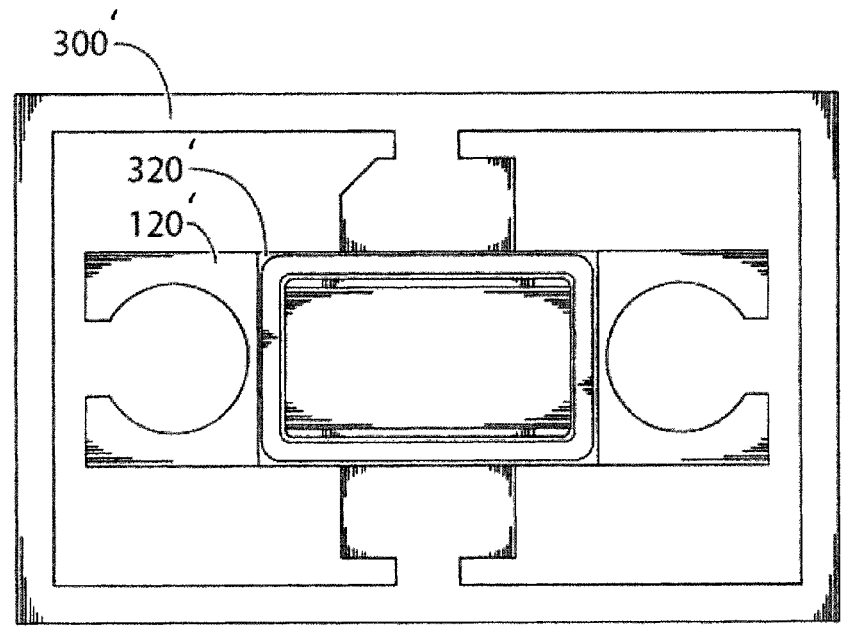
Figure 10E:
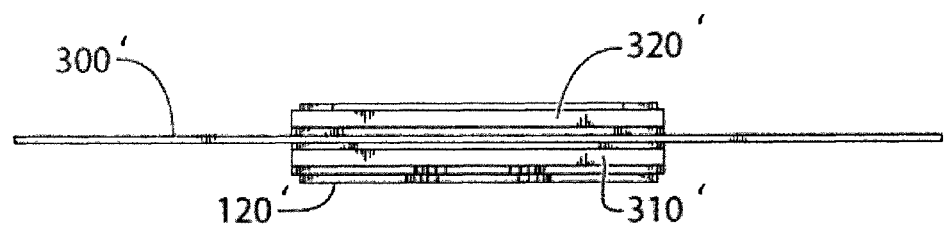

As illustrated in FIGS. 10A and 10B, the leadframe 300' preferably includes a rectangular outer frame that forms one of a plurality of repeating units (not shown) to form a matrix for simultaneously fabrication a post-manufacturing singulation, as discussed above. Also, although only a pair of leads 130' are shown extending from opposite sides of the leadframe, it is contemplated that two or more leads may extend from each side, depending on the intended application of the cavity package.

A further thermally conductive and electrically insulating intermediate ring-type structure 320' is then attached (step 205') to the top surface of leads 130' of leadframe 300'. The further intermediate structure 320' is of similar "sandwich" construction as the first structure 310'. The bottom thin layer of copper is attached to the metal leads 310' such that the pattern can be either a broken ring (i.e. "[ ]") or a parallel line pair, whereas the top thin layer of the copper forms a complete ring pattern onto which a lid is attached (see FIGS. 14A and 14B).

Figure 11A:
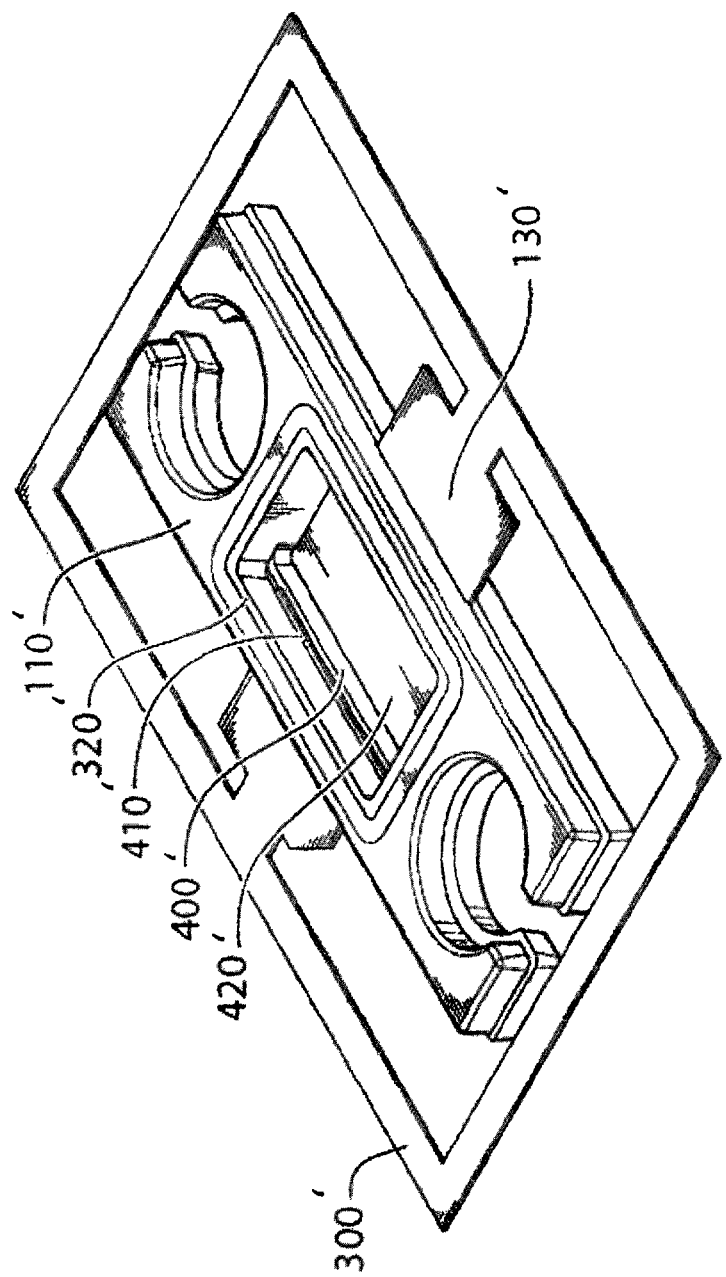
FIGS. 11A and 11B are top and bottom perspective views, respectively, showing the molding of a plastic body onto the integrated heat sink and leadframe of FIGS. 10A and 10B, for forming a cavity, according to the method of FIG. 9.
Figure 11B:
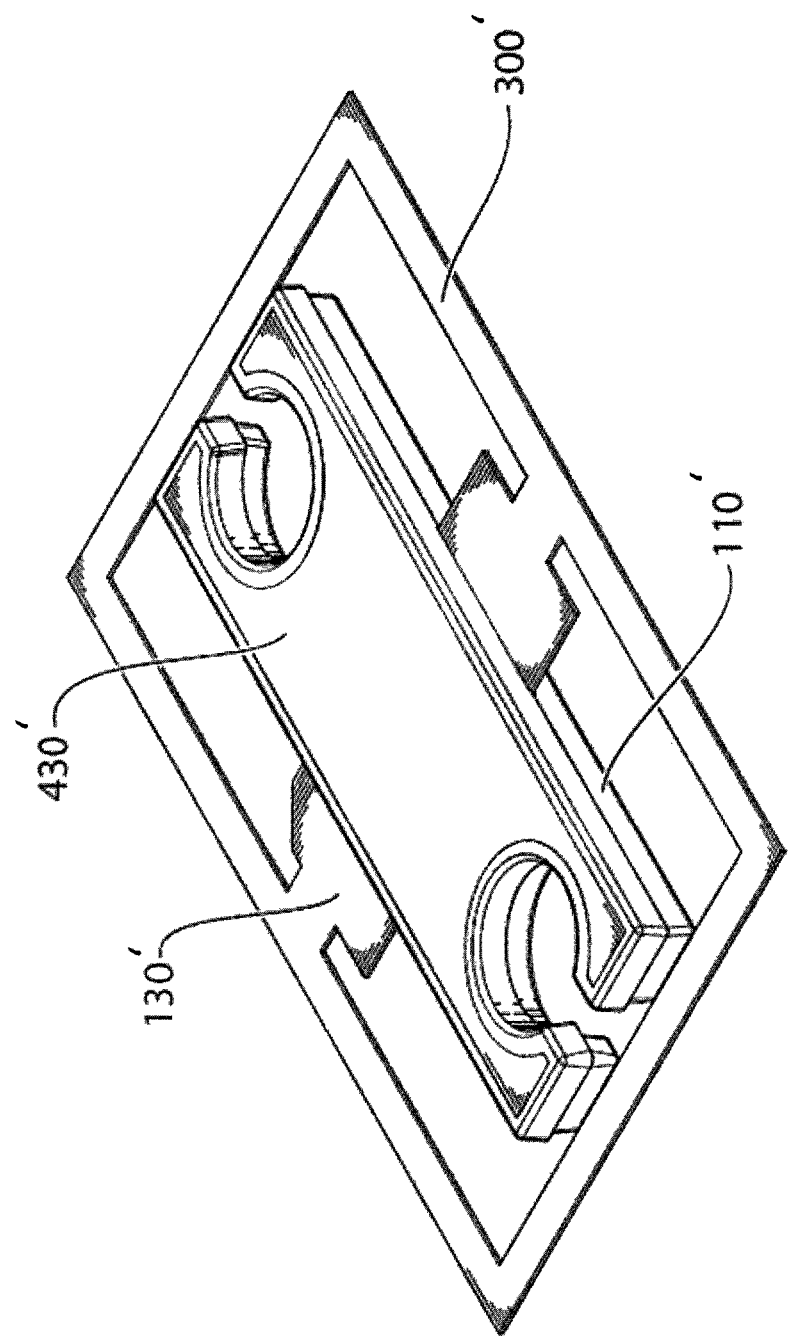

At step 210', plastic body 110' is molded around the integrated heat sink 120' and leads 130' of leadframe 300' to form a cavity 400', with partially and selectively exposed lead top surface 410', heat sink top surface 420', heat sink bottom surface 430', and top surface of ring-type structure 320', as shown in FIGS. 11-11C. The exposed heat sink bottom surface 430' conducts heat from the cavity 400' to be dissipated in a mother board (not shown) to which the cavity package is mounted post-fabrication.

Figure 12A:
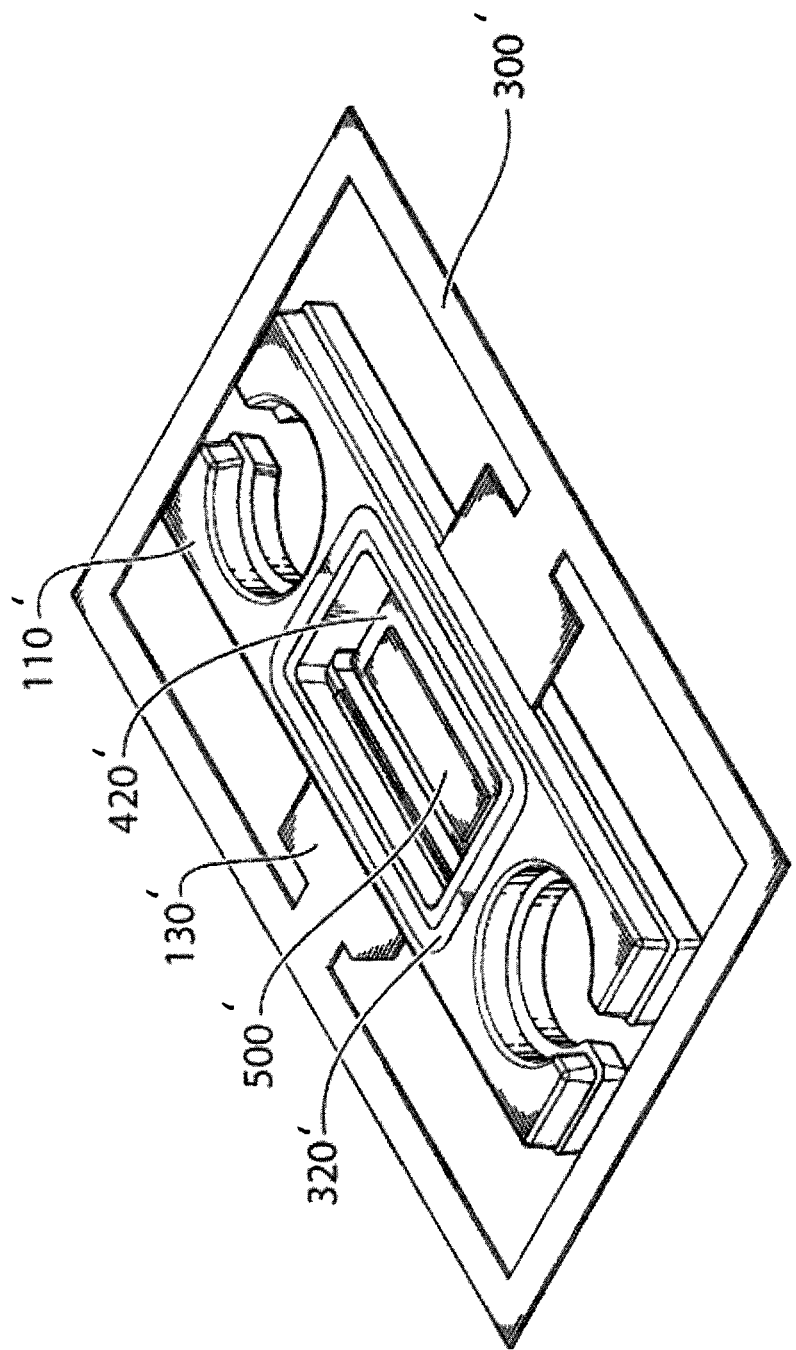
FIGS. 12A and 12B are top perspective and plan views, respectively, showing attachment of a semiconductor die (integrated circuit) onto an exposed portion of the heat sink within the cavity, according to the method of FIG. 9.
Figure 12B:
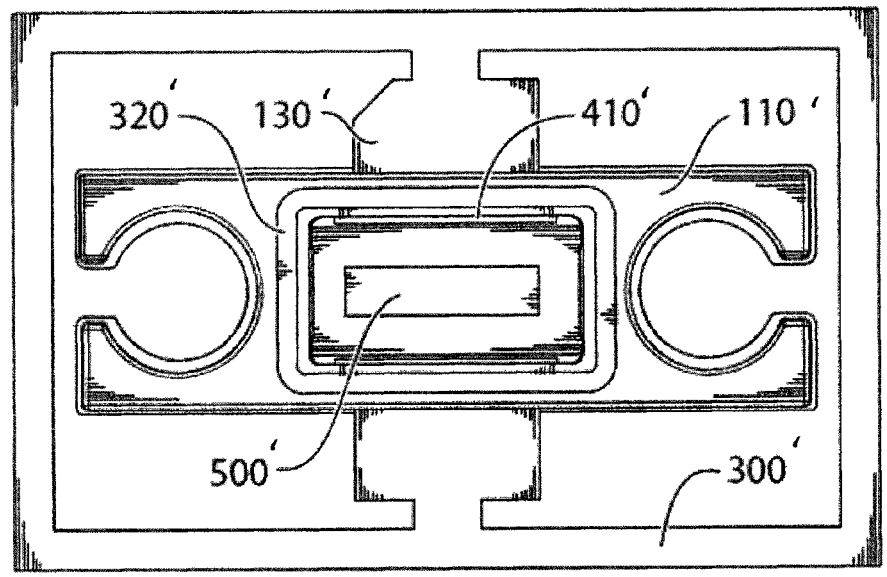

At step 220', a semiconductor device die 500' (i.e. the IC) is placed within cavity 400' on to exposed top surface 420' of the heat sink and attached to the using a thermal conductive material, such as silver epoxy, solder, etc., as shown in FIGS. 12A and 12B.

Figure 13A:
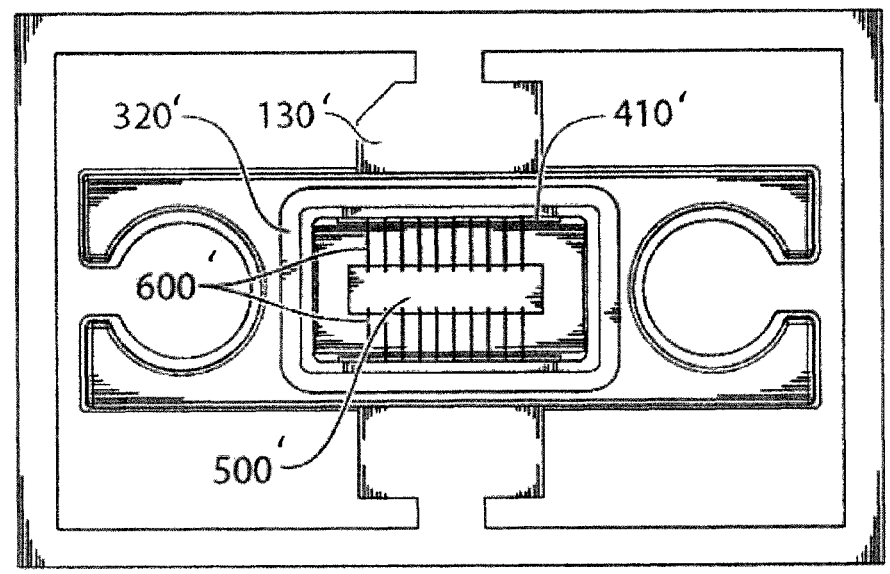
FIGS. 13A and 13B are top perspective detail and full views, respectively, showing wire bonding of the die to exposed lead top surfaces, according to the method of FIG. 9.
Figure 13B:
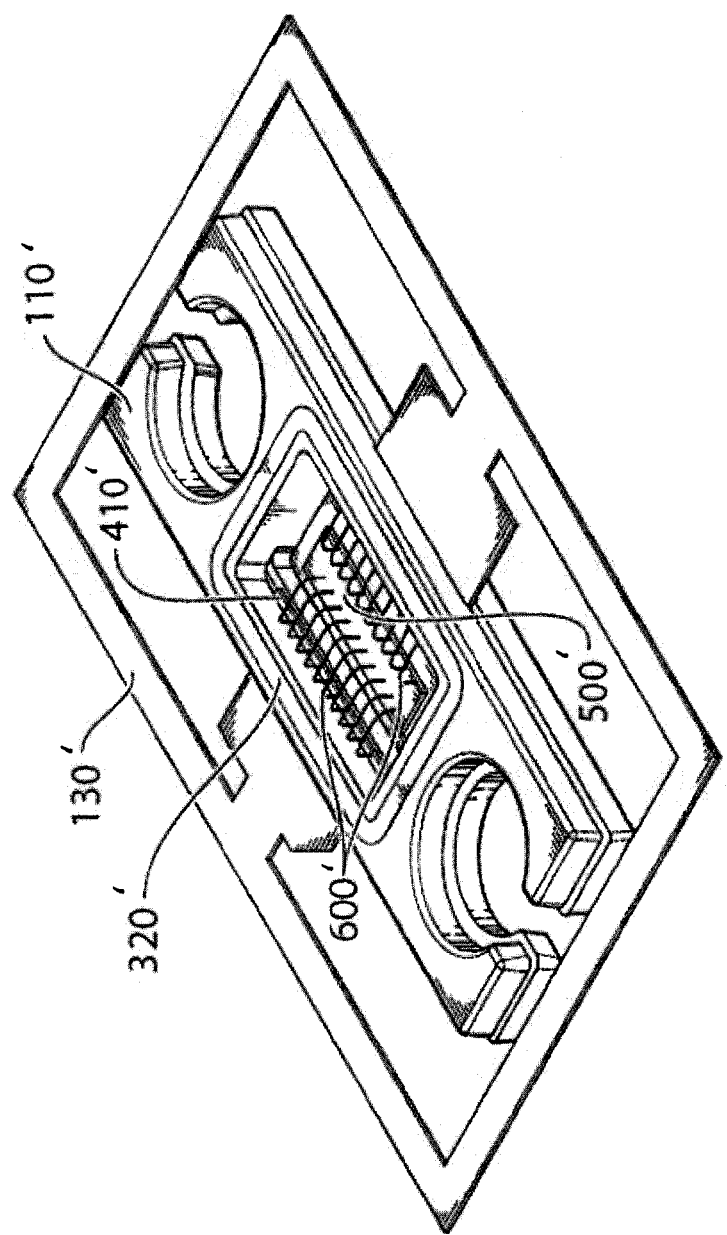
Figure 14A:
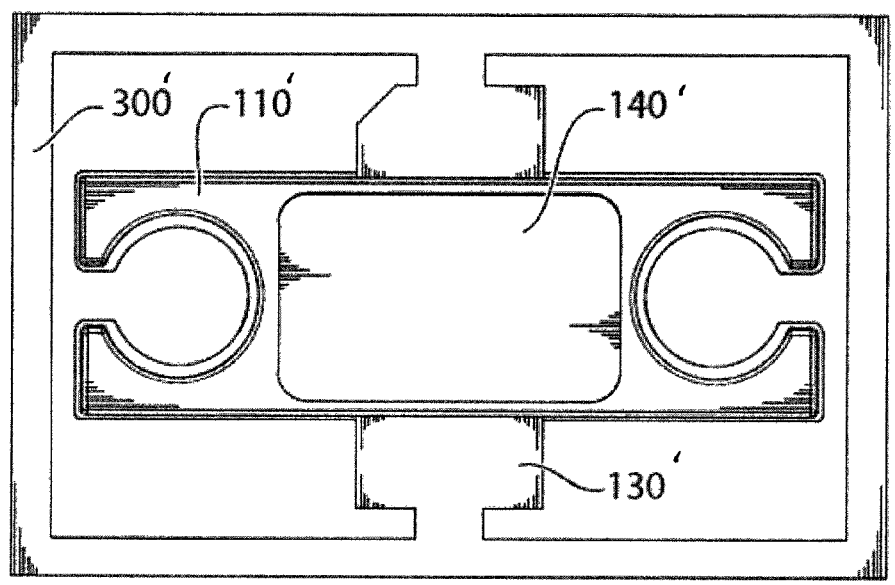
FIGS. 14A and 14B are plan and top perspective views, respectively, showing attachment of a metal lid for covering and sealing the cavity, according to the method of FIG. 9.
Figure 14B:
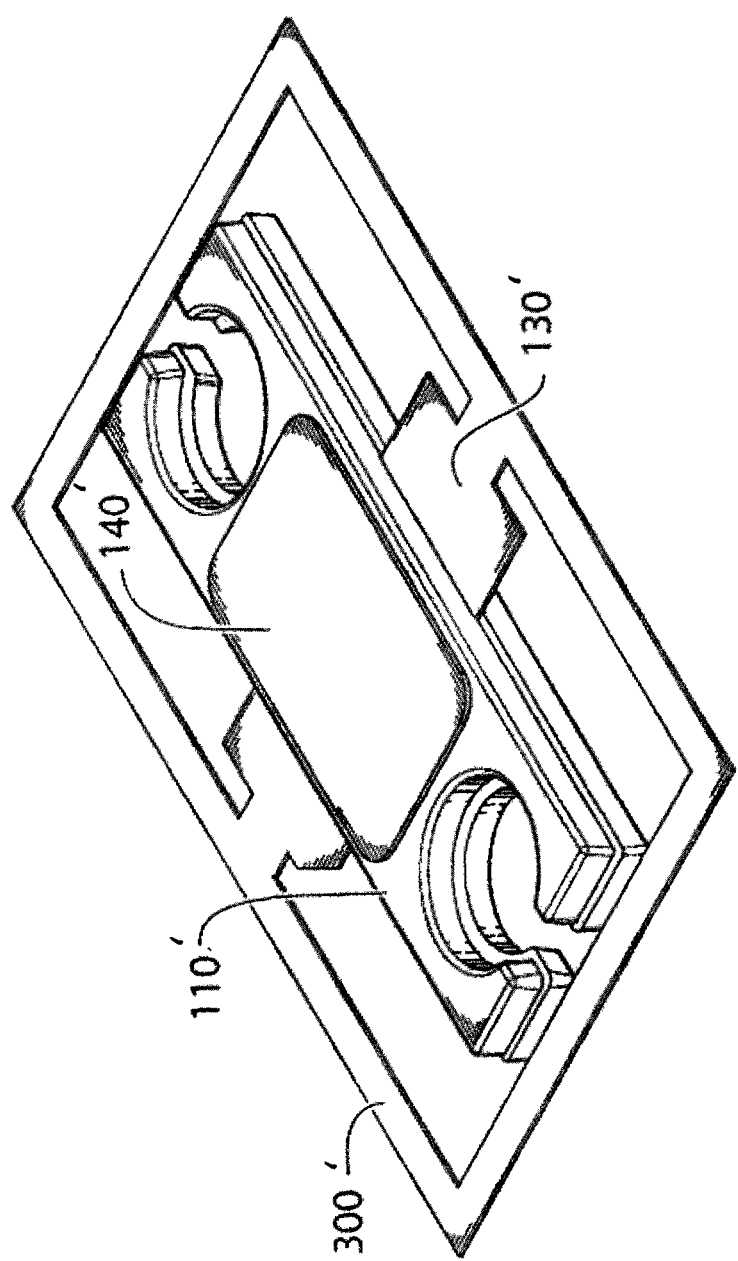

Respective wire bond pads of semiconductor device die 500' are then wire bonded 600' to the exposed lead top surfaces 410' and to the heat sink 120' for grounding, at step 230', as shown in FIGS. 13A and 13B. For example, when used in a high power, high frequency application such as a RF switching transistor, one lead is bonded to the transistor source, the other lead is bonded to the transistor gate, with the entire die back side acting as the drain such that once the die is attached to the heat sink 120', the heat sink becomes the drain. The top of the die 500' has both a source pad as well as the gate pad wire bonded respectively to the two leads 130'.

Finally, at step 240', metal lid 140' is attached to the plastic molded body 110' by means of soldering to the top exposed ring on the further (i.e. top) intermediate structure 320'. The metal lid 140' is stronger than a plastic lid, is cheaper than ceramic, and can be fabricated from a one of many metals such as copper or stainless steel with plated nickel or tin.

As discussed above, in practice a matrix of cavity packages is fabricated (not shown) such that after the lid 140' has been attached, the matrix is singulated (e.g. using saw singulation) to create packages, such as the package shown in FIGS. 8A and 8B.

Figure 15:
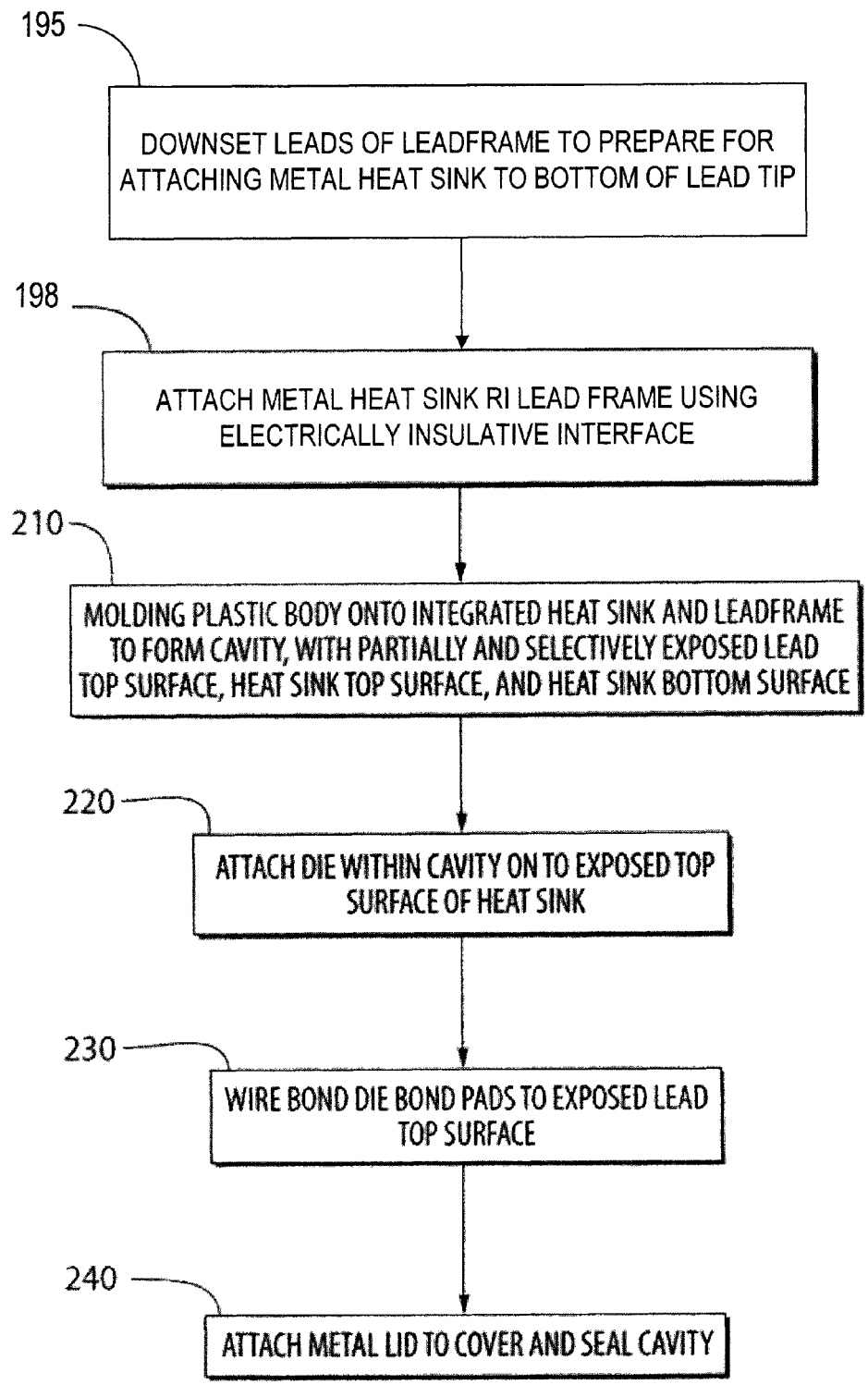
FIG. 15 is a flow chart showing steps of an alternative method for fabricating the cavity package of FIGS. 1A and 1B.

FIG. 15 is a flow chart showing steps of an alternative method for fabricating the cavity package of FIGS. 1A and 1B, where steps 210-240 are identical to the method of FIG. 2. The alternative method is a lower cost alternative to the method of FIG. 2 because it eliminates the need for intermediate structure 310.

Figure 16:
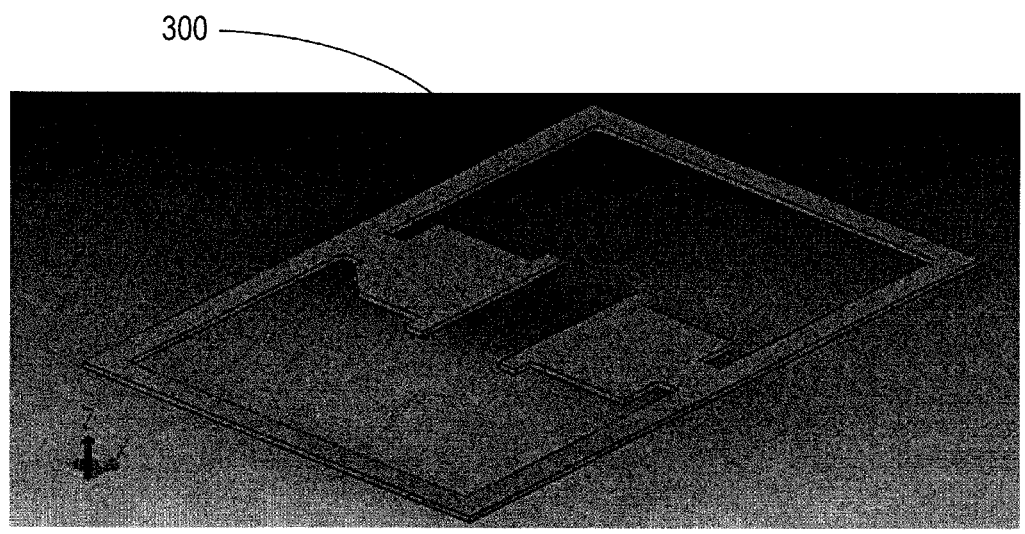
FIG. 16 is a top perspective view of a leadframe for the cavity package of FIGS. 1A and 1B.
Figure 17:
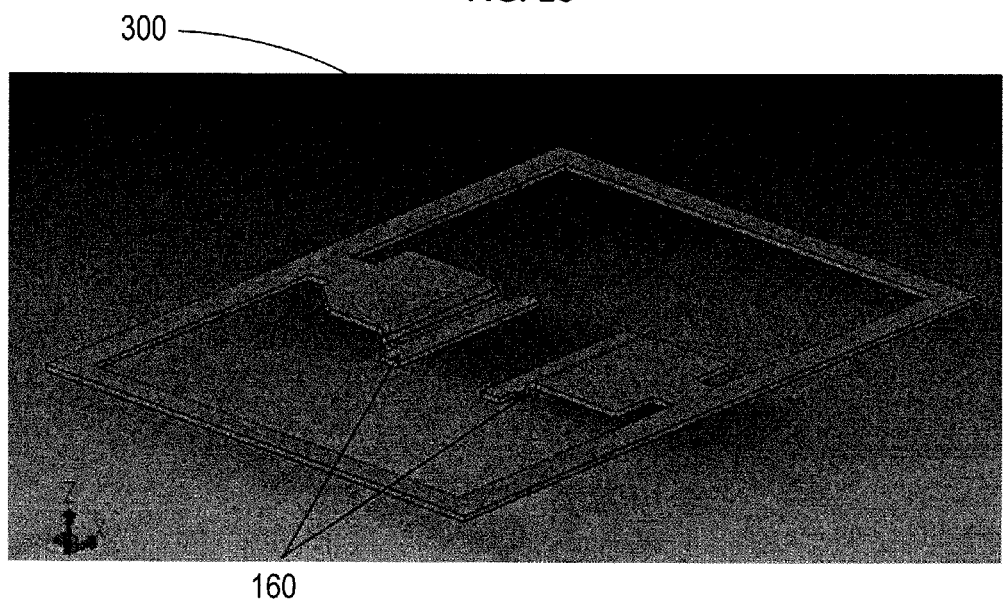
FIG. 17 is a top perspective view showing a pair of leads of the leadframe each bent downwardly to form a step, according to the alternative method for fabricating the cavity package of FIG. 15.
Figure 18:
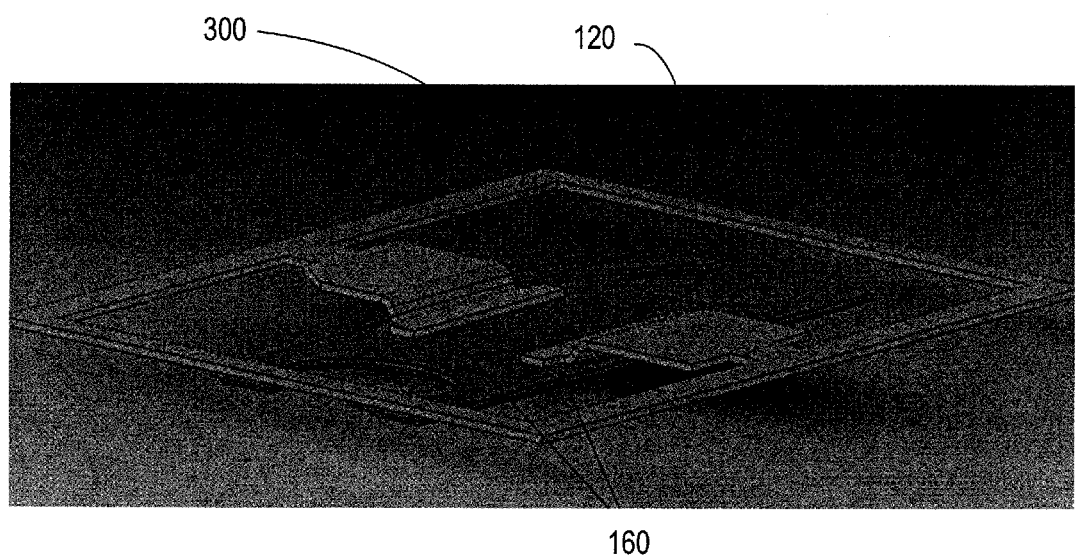
FIG. 18 is a top perspective view showing attachment of a heat sink to the bottom of the leadframe, according to the alternative method of FIG. 15.

At step 195, a leadframe 300, as depicted in FIG. 16, is prepared for attaching the heatsink 120 thereto, by bending lead tips 160 downwardly by a predetermined amount to form a step, as shown in FIG. 17.

At step 198, the metal heat sink 120 (e.g. Cu or other metal alloy) is attached to the bottom of the leadframe 300 using an electrically insulative interface (e.g. non-conductive epoxy, double sided adhesive tape, etc. . . ).

Following the heat sink attachment step 198, the remaining molding, die attach, wire bonding and lid attachment steps 210-240 are performed, as discussed above with reference to FIG. 2.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method of manufacturing a cavity package comprising:
   i) attaching a metal heat sink to a leadframe having two or more metal leads, using a first intermediate ring-type structure that is thermally conductive and electrically insulating;
   ii) attaching a further thermally conductive and electrically insulating ring-type intermediate structure to a top of the leadframe;
   iii) molding a plastic body around the metal heat sink and the two or more metal leads of the leadframe to form a cavity, with partially and selectively exposed lead top surface, a heat sink top surface, a heat sink bottom surface, and a top surface of the further thermally conductive and electrically insulating ring-type intermediate structure;
   iv) attaching a semiconductor device die within the cavity on to an exposed top surface of the metal heat sink using a thermal conductive material;
   v) wire bonding respective wire bond pads of the semiconductor device die to the partially and selectively exposed lead top surface and to the metal heat sink for grounding; and
   vi) attaching a metal lid to the plastic body by means of soldering to the top surface of the further thermally conductive and electrically insulating ring-type intermediate structure to protect the semiconductor device die within the cavity.

2. A cavity package constructed in accordance with the method of claim 1, wherein each of the first intermediate ring type structure and the further thermally conductive and electrically insulating ring-type structure comprises a sandwich of thin metal portions bonded to top and bottom surfaces of a ceramic middle portion.

3. The cavity package according to claim 2, wherein opposite sides of a top thin metal portion of the first intermediate ring-type structure are bonded to respective bottom surfaces of the metal leads, and a bottom surface of the first intermediate ring-type structure is bonded to the metal heat sink.

4. The cavity package according to claim 3, wherein opposite sides of a bottom thin metal portion of the further thermally conductive and electrically insulating ring-type structure are bonded to respective top surfaces of the metal leads.

* * * * *